United States Patent
Maishev et al.

[11] Patent Number: 6,153,067
[45] Date of Patent: Nov. 28, 2000

[54] METHOD FOR COMBINED TREATMENT OF AN OBJECT WITH AN ION BEAM AND A MAGNETRON PLASMA WITH A COMBINED MAGNETRON-PLASMA AND ION-BEAM SOURCE

[75] Inventors: Yuri Maishev, Moscow, Russian Federation; James Ritter, Fremont; Leonid Velikov, San Carlos, both of Calif.

[73] Assignee: Advanced Ion Technology, Inc.

[21] Appl. No.: 09/222,015

[22] Filed: Dec. 30, 1998

[51] Int. Cl.⁷ .................................................. C23C 14/00
[52] U.S. Cl. ................ 204/298.04; 204/298.12; 204/298.16; 204/298.19
[58] Field of Search .......... 204/298.04, 192.11, 204/192.12, 298.16, 298.17, 298.18, 298.19, 298.2, 298.21, 298.22, 298.05, 298.26, 298.12

[56] References Cited

U.S. PATENT DOCUMENTS

| | | |
|---|---|---|
| 4,122,347 | 10/1978 | Kovalsky et al. |
| 4,450,031 | 5/1984 | Ono et al. ............................ 204/298.04 |
| 4,492,620 | 1/1985 | Matsuo et al. ...................... 204/192.11 |
| 4,684,848 | 8/1987 | Kaufman . |
| 4,710,283 | 12/1987 | Singh et al. . |
| 4,747,922 | 5/1988 | Sharp ................................. 204/298.04 |
| 5,242,707 | 9/1993 | Esener et al. ...................... 204/192.11 |
| 5,279,724 | 1/1994 | Rauch et al. ....................... 204/298.26 |
| 5,288,386 | 2/1994 | Yanagi et al. ...................... 204/298.12 |
| 5,490,910 | 2/1996 | Nelson et al. ...................... 204/298.26 |
| 5,618,389 | 4/1997 | Kreider . |
| 5,656,138 | 8/1997 | Scobey et al. ..................... 204/298.04 |

FOREIGN PATENT DOCUMENTS

| | | |
|---|---|---|
| 2-228471 | 9/1990 | Japan ................................. 204/298.04 |
| 2030807 | 3/1995 | Russian Federation . |

OTHER PUBLICATIONS

Kaufman H.R. et al. End Kall Ion Source, J. Vac Sci. Technol, vol. 5, Jul./Aug., 1987, pp. 2081–2084.

J. Reece Roth "Industrial Plasma Engineering", Institute of Physics Publishing, Bristor–Philad., 1995, p. 337.

*Primary Examiner*—Nam Nguyen
*Assistant Examiner*—Gregg Cantelmo

[57] ABSTRACT

A method for combined treatment of an object simultaneously with an ion beam and a magnetron plasma consists in that an object, e.g., a semiconductor substrate, is treated with ions of a working gas emitted from an ion-beam source and with particles of a sputterable material directed toward the object in the same direction as the ion beam. The method is carried our by means of an apparatus that comprises a combination of a sputtering magnetron with an ion-beam source. According to several embodiments, the cathode of the ion source is separated into two parts electrically isolated from each other by a closed-loop ion-emitting slit and by isolation pads. The sputterable target is placed either onto the entire cathode or onto part thereof which is charged negatively with respect to another part which is grounded. During the operation of the apparatus, ion beam emitted from the ion source acts as a viral anode with respect to the magnetron target. As a result, the efficiency and versatility of treatment is improved, and the combined apparatus has smaller dimensions and less expensive than an ion source and magnetron used separately.

28 Claims, 17 Drawing Sheets

METHOD FOR COMBINED TREATMENT OF AN OBJECT WITH AN ION BEAM AND A MAGNETRON PLASMA WITH A COMBINED MAGNETRON-PLASMA AND ION-BEAM SOURCE

FIELD OF THE INVENTION

The present invention relates to the field of ion-emission technique, particularly to an apparatus which combines in itself an ion-beam and magnetron-plasma source intended for cleaning, activation, polishing, or thin-film coating of surfaces. The invention also relates to a method for combined treatment of objects with an ion beam and a magnetron plasma.

BACKGROUND OF THE INVENTION AND DESCRIPTION OF THE PRIOR ART

An ion source is a device that ionizes gas molecules and then focuses, accelerates, and emits them as a narrow beam. This beam is then used for various technical and technological purposes such as cleaning, activation, polishing, thin-film coating, or etching.

An example of an ion source is the so-called Kaufman ion source, also known as a Kaufman ion engine or an electron-bombardment ion source described in U.S. Pat. No. 4,684,848 issued to H. R. Kaufman in 1987.

This ion source consists of a discharge chamber, in which a plasma is formed, and an ion-optical system which generates and accelerates an ion beam to an appropriate level of energy. A working medium is supplied to the discharge chamber which contains a hot cathode that functions as a source of electrons and is used for firing and maintaining a gas discharge. The plasma, which is formed in the discharge chamber, acts as an emitter of ions and creates, in the vicinity of the ion-optical system, an ion-emitting surface. As a result, the ion-optical system extracts ions from the aforementioned ion-emitting surface, accelerates them to a required energy level, and forms an ion beam of a required configuration. Typically, aforementioned ion sources utilize two-grid or three-grid ion-optical systems.

A disadvantage of such a device is that it requires the use of ion accelerating grids and produces an ion beam of low intensity.

Attempts have been made to provide ion sources with ion beams of higher intensity by holding the electrons in a closed space between a cathode and an anode where the electrons could be held. For example, U.S. Pat. No. 4,122,347 issued in 1978 to Kovalsky et al. describes an ion source with a closed-loop trajectory of electrons for ion-beam etching and deposition of thin films, wherein the ions are taken from the boundaries of a plasma formed in a gas-discharge chamber with a hot cathode. The ion beam is intensified by a flow of electrons which are held in crossed electrical and magnetic fields within the accelerating space and which compensate for the positive spatial charge of the ion beam.

A disadvantage of devices of such type is that they do not allow formation of ion beams of chemically-active substances for ion beams capable of treating large surface areas. Other disadvantages of the aforementioned devices are short service life and high non-uniformity of ion beams.

U.S. Pat. No. 4,710,283 issued in 1997 to Singh et al. describes a cold-cathode type ion source with crossed electric and magnetic fields for ionization of a working substance wherein entrapment of electrons and generation of the ion beam are performed with the use of a grid-like electrode. This source is advantageous in that it forms belt-like and tubular ion beams emitted in one or two opposite directions.

However, the ion source with a grid-like electrode of the type disclosed in U.S. Pat. No. 4,710,283 has a number of disadvantages consisting in that the grid-ike electrode makes it difficult to produce an extended ion beam and in that the ion beam is additionally contaminated as a result of sputtering of the material from the surface of the grid-like electrode. Furthermore, with the lapse of time the grid-like electrode is deformed whereby the service life of the ion source as a whole is shortened.

Other publications (e.g., Kaufman H. R. et al. (End Hall Ion Source, J. Vac. Sci. Technol., Vol. 5, July/August, 1987, pp. 2081–2084; Wykoff C. A. et al., 50-cm Linear Gridless Source, Eighth International Vacuum Web Coating Conference, Nov. 6–8, 1994)) disclose an ion source that forms conical or belt-like ion beams in crossed electrical and magnetic fields. The device consists of a cathode, a hollow anode with a conical opening, a system for the supply of a working gas, a magnetic system, a source of electric supply, and a source of electrons with a hot cathode. A disadvantage of this device is that it requires the use of a source of electrons with a hot or hollow cathode and that it has electrons of low energy level in the zone of ionization of the working substance. These features create limitations for using chemically-active working substances. Furthermore, a ratio of the ion-emitting slit width to a cathode-anode distance is significantly greater than 1, and this decreases the energy of electrons in the charge gap, and hence, hinders ionization of the working substance. Configuration of the electrodes used in the ion beam of such sources leads to a significant divergence of the ion beam. As a result, the electron beam cannot be delivered to a distant object and is to a greater degree subject to contamination with the material of the electrode. In other words, the device described in the aforementioned literature is extremely limited in its capacity to create an extended uniform belt-like ion beam. For example, at a distance of 36 cm from the point of emission, the beam uniformity did not exceed ±70%.

Russian Patent No. 2,030,807 issued in 1995 to M. Parfenyonok, et al. describes an ion source that comprises a magnetoconductive housing used as a code having an ion-emitting slit, an anode arranged in the housing symmetrically with respect to the emitting slit, a magetomotance source, a working gas supply system, and a source of electric power supply.

FIGS. 1 and 2 schematically illustrate the aforementioned known ion source with a circular ion-beam emitting slit. More specifically, FIG. 1 is a sectional side view of an ion-beam source with a circular ion-beam emitting slit, and FIG. 2 is a sectional plan view along line II—II of FIG. 1.

The ion source of FIGS. 1 and 2 has a hollow cylindrical housing 40 made of a magnetoconductive material such as Armco steel (a type of a mild steel), which is used as a cathode. Cathode 40 has a cylindrical side wall 42, a closed flat bottom 44 and a flat top side 46 with a circular ion emitting slit 52.

A working gas supply hole 53 is formed in flat bottom 44. Flat top side 46 functions as an accelerating electrode. Placed inside the interior of hollow cylindrical housing 40 between bottom 44 and top side 46 is a magnetic system in the form of a cylindrical permanent magnet 66 with poles N and S of opposite polarity. An N-pole faces flat top side 46 and S-pole faces bottom side 44 of the ion source. The purpose of a magnetic system 66 with a closed magnetic circuit formed by parts 66, 40, 42, and 44 is to induce a magnetic field in ion emitting slit 52. It is understood that this magnetic system is shown only as an example and that it can be formed in a manner described, e.g., in aforementioned U.S. Pat. No. 4,122,347. A circular annular-shaped anode 54 which is connected to a positive pole 56a of an electric power source 56 is arranged in the interior of housing 40 around magnet 66 and concentric thereto. Anode 54 is fixed inside housing 40 by means of a ring 48 made of a non-magnetic dielectric material such as ceramic. Anode 54 has a central opening 55 in which aforementioned permanent magnet 66 is installed with a gap between the outer surface of the magnet and the inner wall of opening 55. A negative pole 56b of electric power source is connected to housing 40 which is grounded at GR.

Located above housing 40 of the ion source of FIGS. 1 and 2 is a sealed vacuum chamber 57 which has an evacuation port 59 connected to a source of vacuum (not shown). An object OB to be treated is supported within chamber 57 above ion emitting slit 52, e.g., by gluing it to an insulator block 61 rigidly attached to the housing of vacuum chamber 57 by a bolt 63 but so that object OB remains electrically and magnetically isolated from the housing of vacuum chamber 57. However, object OB is electrically connected via a line 56c to negative pole 56b of power source 56. Since the interior of housing 40 communicates with the interior of vacuum chamber 57, all lines that electrically connect power source 56 with anode 54 and object OB should pass into the interior of housing 40 and vacuum chamber 57 via conventional commercially-produced electrical feedthrough devices which allow electrical connections with parts and mechanisms of sealed chambers without violation of their sealing conditions. In FIG. 1, these feedthrough devices are shown schematically and designated by reference numerals 40a and 57a. Reference numeral 57b designates a seal for sealing connection of vacuum chamber 57 to housing 40.

The known ion source of the type shown in FIGS. 1 and 2 is intended for the formation of a unilaterally directed tubular ion beam. The source of FIGS. 1 and 2 forms a tubular ion beam IB emitted in the direction of arrow A and operates as follows.

Vacuum chamber 57 is evacuated, and a working gas is fed into the interior of housing 40 of the ion source. A magnetic field is generated by magnet 66 in the accelerating gap between abode 54 and cathode 40, whereby electrons begin to drift in a closed path within the crossed electrical and magnetic fields. A plasma 58 is formed between anode 54 and cathode 40. When the working gas is passed through the ionization gap, tubular ion beam IB, which is propagated in the axial direction of the ion source shown by an arrow A, is formed in the area of an ion-emitting slit 52 and in an accelerating gap 52a between anode 54 and cathode 40.

The above description of the electron drift is simplified to ease understanding of the principle of the invention. In reality, the phenomenon of generation of ions in the ion source with a closed-loop drift of electrons in crossed electric and magnetic fields is of a more complicated nature and consists in the following.

When, at starting the ion source, a voltage between anode 54 and cathode 40 reaches a predetermined level, a gas discharge occurs in anode-cathode gap 52a. As a result, the electrons, which have been generated as a result of ionization, begin to migrate towards anode 54 under the effect of collisions and oscillations. After being accelerated by the electric field, the ions pass through ion-emitting slit 52 and are emitted from the ion source. Inside the ion-emitting slit, the crossed electric and magnetic fields force the electrons to move along closed cycloid trajectories. This phenomenon is known as "magnetization" of electrons. The magnetized electrons remain drifting in a closed space between two parts of the cathode, i.e., between those facing parts of cathode 40 which form ion-emitting slit 52. The radius of the cycloids is, in fact, the so-called doubled Larmor radius $R_L$ which is represented by the following formula:

$$R_L = meV/|e|B,$$

where m is a mass of the electron, B is the strength of the magnetic field inside the slit, V is a velocity of the electrons in the direction perpendicular to the direction of the magnetic field, and $|e|$ is the charge of the electron.

It is required that the height of the electron drifting space in the ion-emission direction be much greater than the aforementioned Larmor radius. This means that a part of the ionization area penetrates into ion-emitting slit 52 where electrons can be maintained in a drifting state over a long period of time. In other words, a spat charge of high density is formed in ion-emitting slit 52.

When a working medium, such as argon which has neutral molecules, is injected into the slit, the molecules are ionized by the electrons present in this slit and are accelerated by the electric field. As a result, the thus formed ions are emitted from the slit towards the object. Since the spatial charge has high density, an ion beam of high density is formed. This beam can be converged or diverged by known technique for specific applications.

Thus, the electrons do not drift in a plane, but rather along cycloid trajectories across ion-emitting slit 52. However, for the sake of convenience of description, here and hereinafter such expression as "electron drifting plane" or "drifting in the direction of ion-beam propagation" will be used.

The diameter of the tubular ion beam formed by means of such an ion source may reach 500 mm and more.

The ion source of the type shown in FIG. 1 is not limited to a cylindrical configuration and may have an elliptical or an oval-shaped cross section as shown in FIG. 3. FIG. 3 is a cross-sectional view of the ion-beam source along line III—III of FIG. 1. In FIG. 3 the parts of the ion beam source that correspond to similar parts of the previous embodiment are designated by the same reference numerals with an addition of subscript OV. Structurally, this ion source is the same as the one shown in FIG. 1 with the exception that a cathode $40_{ov}$, anode $54_{ov}$, a magnet $66_{ov}$, and hence an emitting slit (not shown in FIG. 3), have an oval-shaped configuration. As a result, a belt-like ion beam having a width of up to 1400 mm can be formed. Such an ion beam source is suitable for treating large-surface objects when these objects are passed over ion beam IB emitted through emitting slit 52.

With 1 to 3 kV voltage on the anode and various working gasses, this source makes it possible to obtain ion beams with currents of 0.5 to 1 A. In this case, an average ion energy is within 400 to 1500 eV, and nonuniformity of treatment over the entire width of a 1400 mm-wide object does not exceed ±5%.

Nevertheless, the aforementioned belt-type ion source is disadvantageous in that for use in sputtering, this ion source also requires the use of spatially located targets of sputterable material. This increases the overall dimensions of a sputtering system. A sputtering system of such type is disclosed in pending U.S. patent application No. 09/161,581 of the same applicants filed in September 1998.

The above problems are partially solved by a device which in the sputtering technology is known as a magnetron plasma source. Such a device is described, e.g., by J. Reece Roth in "Industrial Plasma Engineering", Institute of Physics Publishing, Bristol and Philadelphia, 1995, p. 337. Basically, a magnetron plasma source, which hereinafter will be referred-to as "sputtering magnetron", incorporates a crosswise magnetic field over the cathode, which traps the beam electrons in orbits in that location and thus greatly increases their path length before they finally escape to the anode by collisional scattering. Because the electron's travel path becomes longer than the electron gap, the minimum pressure to sustain the plasma is much lower for the sputtering magnetron, e.g., for a planar diode—typically 0.1 Pa instead of 3 Pa. At 0.1 Pa, the sputtered particles retain most of their kinetic energy upon reaching the substrate, so the one obtains the beneficial effects of this energy. A planar diode is a plasma source device which consists of two parallel electrodes, namely cathode and anode, where the cathode is grounded and the anode is under a high positive potential with respect to the ground. If a plasma is generated in a cathode-anode space and an object is placed into this plasma, the material of the cathode will be deposited on the object.

A typical sputtering magnetron construction is shown in FIG. 4 which is a sectional three-dimensional view of a planar-magnetron structure. In this drawing, for clarity, the electron orbit radius is shown much larger than the aual size.

The device consists of a vacuum chamber 100 the walls of which function as an anode. The bottom of the chamber is formed by a water-cooled copper backing plate 102 which supports a target 104 of a sputterable material in the form of a 3 to 10 mm thick disk which is bonded for good thermal contact to backing plate 102. Bonding can be done by soldering, or through an epoxy resin, but preferably through clamping in order to provide possibility for replacing sputterable target 104 after its consumption. Vacuum chamber 100 is sealed by an insulating ring 105, e.g., of ceramic, placed between the lower end of vacuum chamber 100 and the flange of the copper backing plate 102. The vacuum chamber wall or an anode assembly is grounded at G. The cathode assembly is formed by copper backing plate 102, a ring of bar magnets 106 and one central magnet 108 inserted into the respective recesses 110 and 112 of backing plate 102, and a Fe field return plate 114 for completion of the magnetic field. The cathode is under a high negative potential, e.g., of about −700 to 1000 V. Using the strongest magnets (Nd—Fe—B), the field over the target can approach 1 KGa, or 0.1 T in SI units.

Upon igniting the plasma, beam electrons emitted from the cathode become accelerated into the plasma by the cathode-sheath electric field E, just as in the case of a planar diode. The presence of the magnetic field B, however, causes them also to curve into orbits, and the plasma electrons are magnetized, as was described earlier. The ions, however, are not magnetized. The sputtering magnetron will still operate as a sputtering source at much higher pressure, but gas scattering will dominate electron behavior rather than B.

At low pressure, the sputtering magnetron operates as follows: electrons emitted from the sputterable target surface or created by ionization in the sheath field are accelerated vertically by E but, at the same time, forced sidewise by B, so they eventually reverse direction and return toward sputterable target 104, decelerating in E as they proceed until their direction is again reversed and the cycle repeats. As has been described earlier, the electrons would follow a "cycloidal" path. In reality, the path is more complicated because of collision and because E decreases with distance from sputterable target 104.

Also, deposition rate is increased in the sputtering magnetron because of reduced scattering and redeposition of sputtered particles on the cathode. Finally, the increased efficiency of electron usage means that lower applied voltage (typically 500 V) is needed to sustain a plasma of a given density, and that the voltage increases even less steeply with power than it does in the planar diode.

A main disadvantage of a sputtering magnetron is that the pressure of the working medium is permanent inside the entire vacuum chamber, i.e., near the sputterable target and near the object (substrate) being treated. The magnitude of this pressure is selected so as to ensure the maximum efficiency of the working gas ionization. This pressure, however, is not always optimum for treating the substrate surface. In other words, the optimum pressure required for surface treatment and the pressure required for optimization of the working gas ionization are contradictory. Another disadvantage of the sputtering magnetron is that the erosion pattern of sputtering magnetron target is highly nonuniform across the target surface.

It is known to combine an ion beam source with a sputtering magnetron in a vacuum chamber for enhancing sputtering. Such a device is described in U.S. Pat. No. 5,618,389 issued in 1996 to K. Kreider. The device is used for producing transparent carbon nitride films. The films are made by using a magnetron sputter gun and an ion beam source in a vacuum chamber. A disadvantage of this device is that it employs two separate and complicated units, i.e., an ion beam source and a sputtering magnetron. This makes the device expensive and with large overall dimensions. The application is limited because the direction of sputtering by the magnetron and by the ion source are different, i.e., the emission occurs under different angles to the surface of the object. However, the geometry of an object being treated not always allows for utilization of two separate processing units, i.e., the ion beam source and the sputtering magnetron emits ion beams or sputter particles under different angles with respect to the surface of the object. Each of these units requires the use of separate power supply sources, gas delivery systems, etc. Optimum modes of operation (gas pressure, gas flows, etc.) are not always compatible for the use of the sputtering magnetron and the ion source simultaneously in a common vacuum chamber.

OBJECTS OF THE INVENTION

It is an object of the invention to provide a sputtering apparatus which is simple in construction, easy to manufacture, small in dimensions, operates with an increased efficiency of sputtering, allows for treating objects of various geometrical configurations, combines a magetron and an ion source in a single device and therefore does not need separate power supply sources, gas delivery systems, etc., for a sputtering magnetron and an ion source. Another object of the invention is to provide a method for combined treatment of objects with a sputtering magnetron and ion-beam source wherein the sputtering direction of the sputtering magnetron coincides with that of the ion source.

SUMMARY OF THE INVENTION

A method for combined treatment of an object simultaneously with an ion beam and a magnetron plasma consists in that an object, e.g., a semiconductor substrate, is treated with ions of a working gas emitted from an ion-beam source and with particles of a sputterable material directed toward the object in the same direction as the ion beam. The method is carried out by means of an apparatus that comprises a combination of a sputtering magnetron with an ion-beam source. According to several embodiments, the cathode of the ion source is separated into two parts electrically isolated from each other by an closed-loop ion-emitting slit and by isolation pads. The sputterable target is placed either onto the entire cathode or onto part thereof which is charged negatively with respect to the other part which is grounded. During the operation of the apparatus, ion beam emitted from the ion source acts as a virtual anode with respect to the magetron target. As a result, the efficiency and versatility of treatment is improved, and the combined apparatus has smaller dimensions and less expensive than an ion source and magnetron used separately.

DETAILED DESCRIPTION OF THE INVENTION

Figure 5:
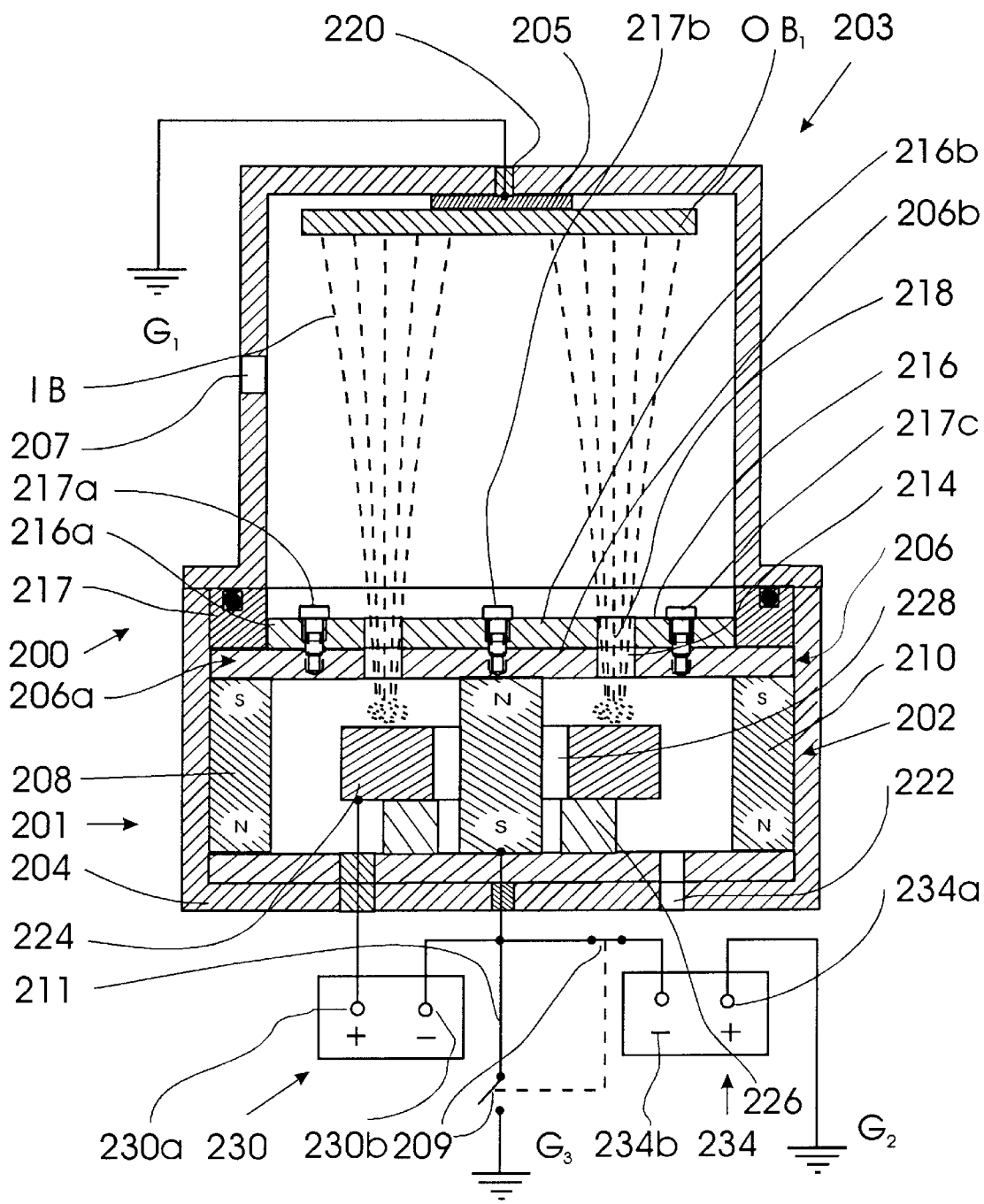
FIG. 5 is a schematic view of an apparatus of the first embodiment of the invention for deposition of films by reactive plasma sputtering in combination ion beam treatment.

FIG. 5—Detailed Description of Apparatus of the Invention with the Anode Power Supply Unit Suspended between the Ground and the Cathode Voltage A schematic view of an apparatus for deposition of films by reactive plasma sputtering is shown in FIG. 5. The apparatus has a box-like housing 200. Housing 200 has a bottom part 201 made of a nonmagnetic and nonconductive material such as ceramic, and an upper part 203. A cathode assembly, which in general is designated by reference numeral 202, is placed inside bottom part 201 and consists of two plates 204 and 206, made of a magnetoconductive material such as Armco steel, and a ring of permanent magnets, two of which, i.e., 208 and 210, are shown in FIG. 5. Northern poles N of these magnets are in contact with lower plate 204, and Southern poles S are in contact with upper plate 206. A central permanent magnet 212, which has orientation of the magnetic poles reversed with respect magnets 208 and 210, is placed in the center of cathode assembly 202 between plates 204 and 206.

Figure 1:
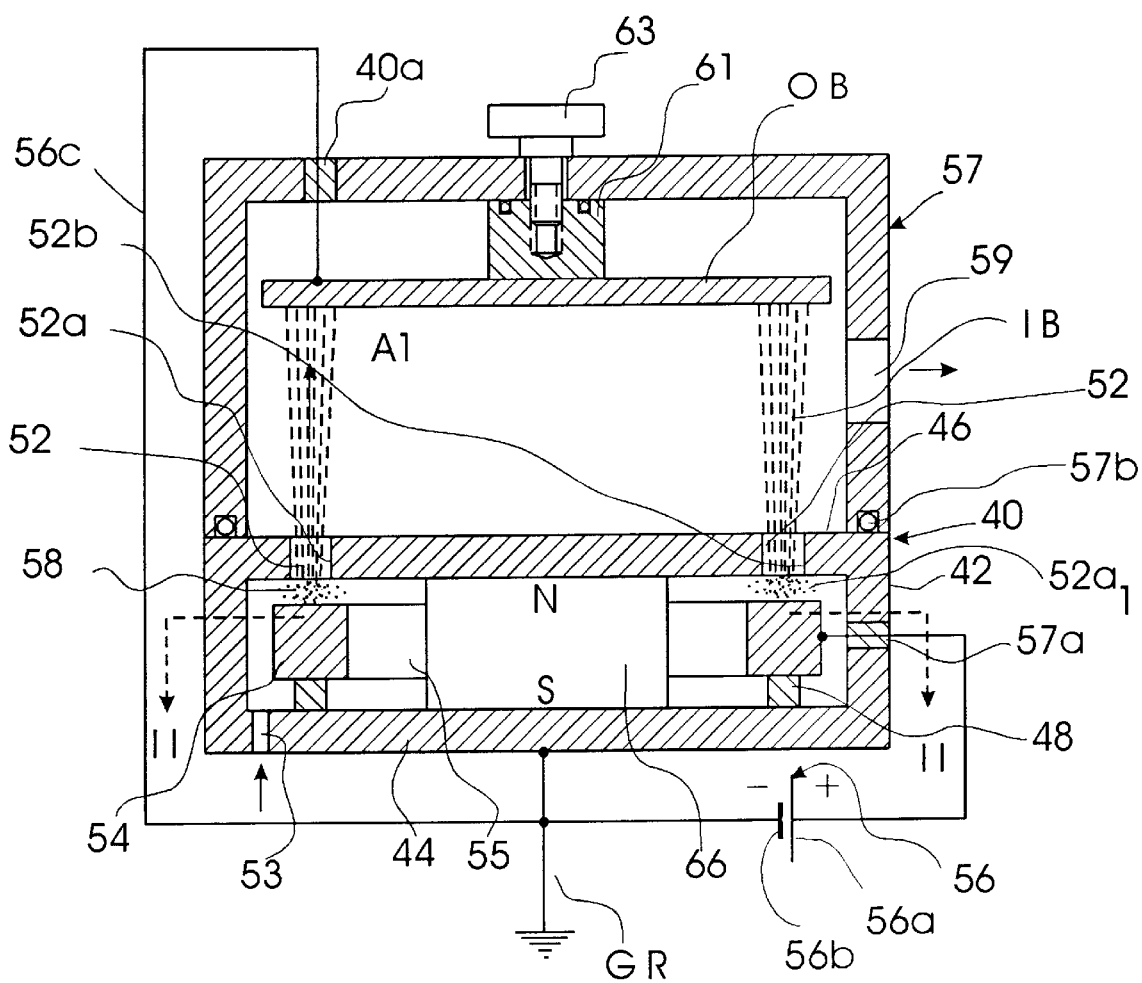
FIG. 1 is a sectional side view of a known ion-beam source with a circular ion-beam emitting slit.
Figure 2:
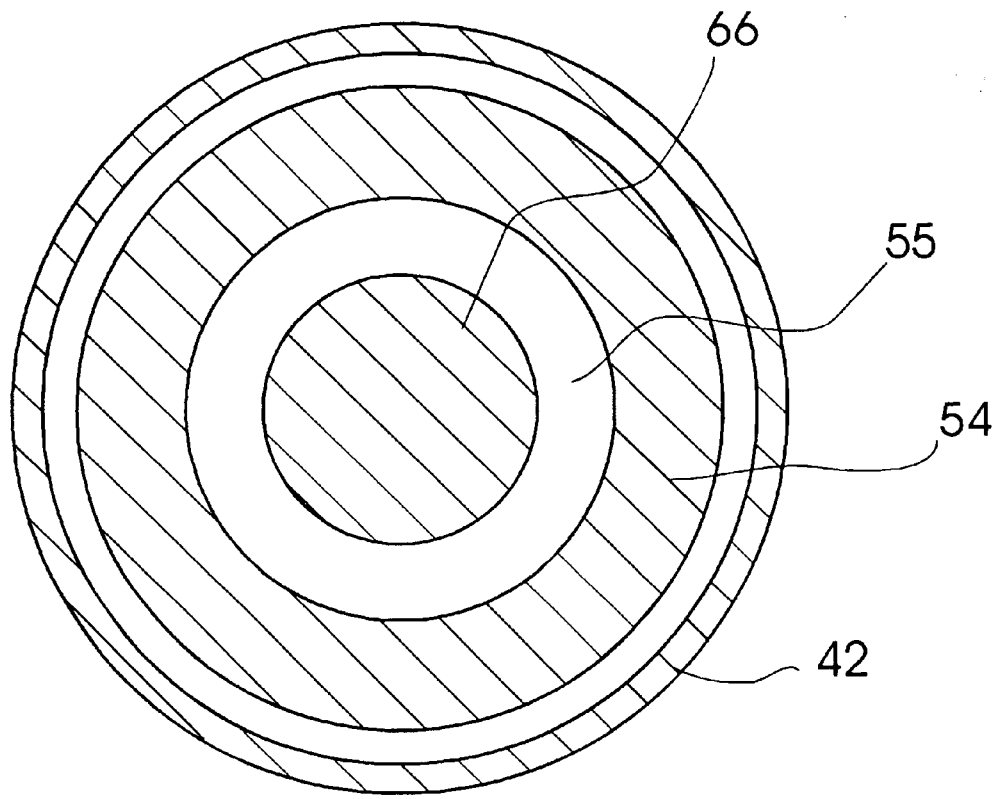
FIG. 2 is a sectional plan view along line II—II of FIG. 1.
Figure 3:
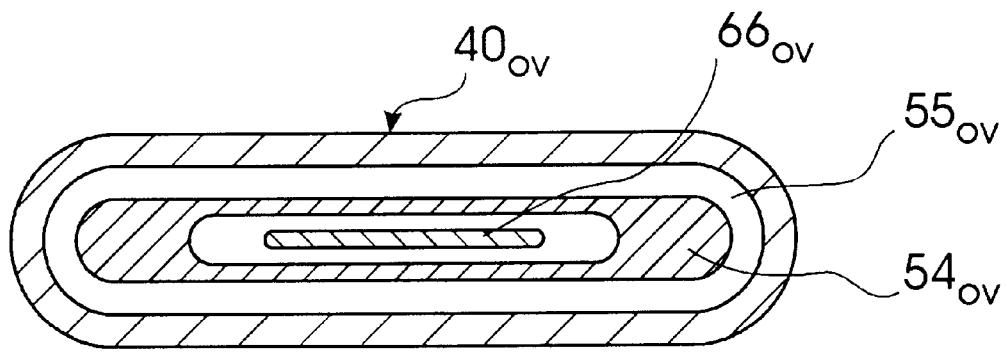
FIG. 3 is a cross-sectional view of the ion-beam source along line III—III of FIG. 1.
Figure 4:
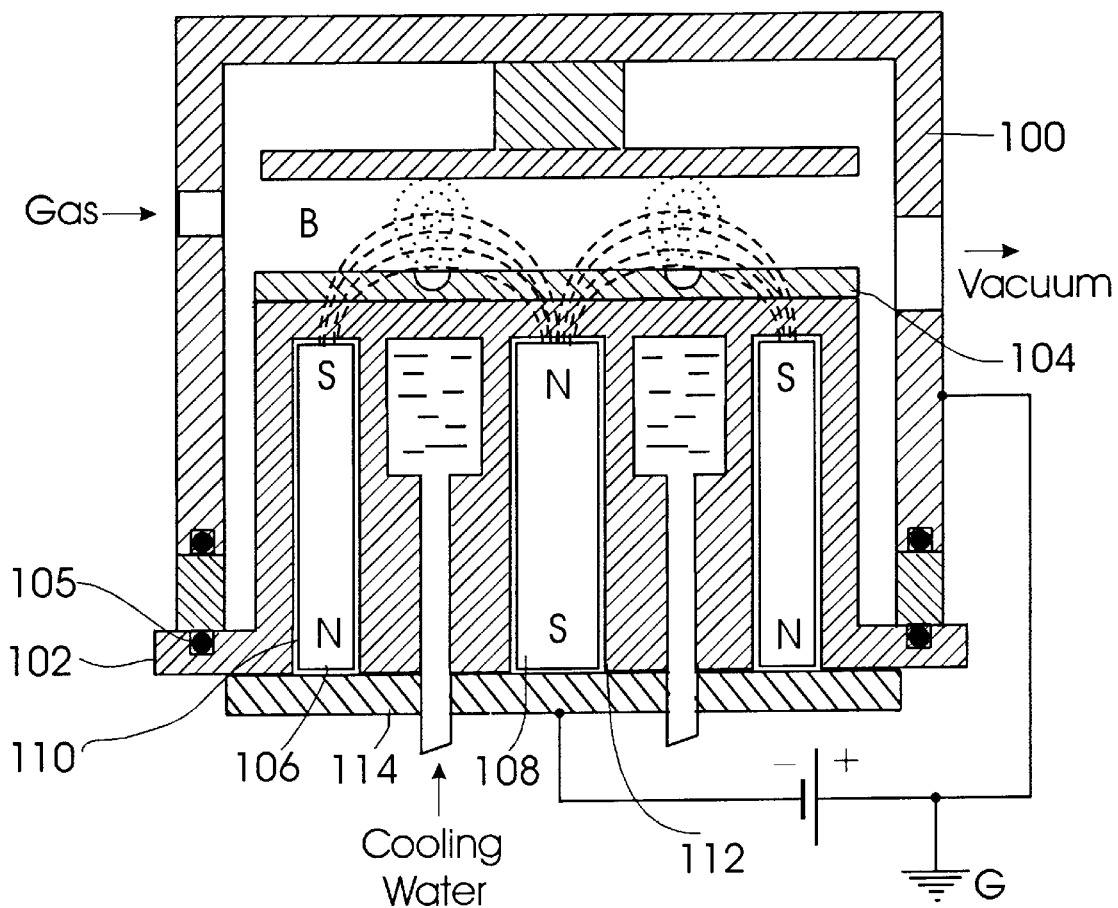
FIG. 4 is a sectional view of a known sputtering magnetron structure.

Upper plate 206 of the cathode has an ion-emitting slit 214, e.g., a closed-loop ion-emitting slit of the type described in connection with the known ion source shown in FIGS. 1 through 3. A plate or target 216 of a sputterable material such as aluminium, titanium, carbon, an alloy such as permaloy, etc., is placed onto upper plate and is firmly attached to it for tight contact, as in the aforementioned sputtering magnetron, e.g., by clamping, or by threaded fasteners 217a, 217b, 217c. Sputterable target 216 has a slit 218 of the same shape as in upper cathode plate 206 and is aligned with slit 214 so as to provide free flow of the working medium and unobstructed emission of ions. Closed-loop ion-emitting slit 214 divides upper cathode plate 206 into an outer part 206a and inner part 206b. Similarly, closed-loop slit 218 divides sputterable target 216 into an outer part 216a and inner part 216b.

Sputterable target 216 is isolated from upper part 203 of the housing by an insulating ring 217. The interior of housing 200 is sealed so that vacuum can be induced inside the housing.

An object $OB_1$ is attached to an object holder 205 located in upper part 203 above sputterable target 216. Object $OB_1$ and holder 205 are electrically isolated from upper part 203 of the housing and are grounded at G1 via an electrical feedtdrough 220. If upper put 203 is made of metal, it also should be grounded. In this case, object $OB_1$ may be in electrical contact with upper part 203 of the housing.

A working medium is injected into housing 200 via a gas supply channel 222 which passes through the bottom of housing 200 and lower plate 204. The working medium is evacuated from housing 200 via an evacuation passage 207 by means of a vacuum pump (not shown).

An anode 224 is supported inside cathode assembly 202 between upper cathode plate 206 and lower cathode plate 204 by a block 226 of non-magnetic dielectric material, such as ceramic. Anode 224 has a central opening 228 through which central magnet 212 passes without physical contact with its walls.

The apparatus of FIG. 5 has the anode power supply unit suspended between the ground and the cathode voltage. In other words, anode 224 is connected to a positive terminal 230a of a power supply source 230, a negative terminal 230b of which is connected to lower cathode plate 204 via an electrical feedthrough 232 which passes through the bottom of lower housing part 201. The positive potential on anode 224 is, e.g., within the range of 1000V to 1500V, and the negative potential on cathode 206, and hence on target 216, is within the range of −100V to −1000V. It is understood that these values are given only as examples and do not limit the range of possible voltages. First power source 230 has its negative terminal 230b connected to a negative terminal 234b of a second power source 234. A positive terminal 234a of power source 234 is grounded at G2. As a result of the aforementioned electrical connections, cathode assembly 202, and hence removable sputterable target 216, are maintained under a negative potential of about −100V to −1000V, e.g., −500V, with respect to the ground.

An electric switch 209 is installed into an electric line 211 which connects negative terminal 230b of power supply source 230 with lower cathode plate 204. When this switch is open, it disconnects lower cathode plate 204 from negative terminal 230b, and at the same time connects it to the ground at G3. In other words, it is possible to selectively connect the cathode and hence target 216 either to the ground or to the source of negative potential.

Operation of the Apparatus of FIG. 5 in a Combined Sputtering Magnetron/Ion Beam Source Mode For starting operation of the apparatus of FIG. 5, an object $OB_1$, e.g., a silicon wafer substrate, is appropriately fixed to object holder 205 inside housing 200. Sputterable target 216 of material required for sputtering and deposition onto object $OB_1$ is then attached by fasteners 217a, 217b, and 217c to upper plate 206 of the cathode. A working medium such as an inert gas, e.g., argon, is injected under a pressure of about 1 mTorr via passage 222 into the interior of lower part 201 of housing 200, whereby the working gas flows into the interior of upper part 203 via a passage 222 and then via ion-emitting slit 214 and slit 218 in sputterable target 216 into the working chamber inside upper part 203 of the housing. The rate of injection of the working medium into the working chamber and the rate of evacuation of the working medium from this chamber, i.e., the pressure difference between the interior of lower part 201 of the housing and upper part 203 of the housing, are then adjusted for optimal sputtering and deposition conditions.

A negative potential of about −500V is then applied from power supply source 234 to cathode assembly 202 and thus to sputterable target 216. A positive voltage of about 1000V to 1500V is applied to anode 224.

A lens-like permanent metric field with induction of about 500 Ga is generated near the sputterable target in the space between outer part 206a and inner part 206b of the cathode, whereas a magnetic field B of 1000 to 1500 Ga is generated across ion-emitting slit 214. The potential difference of 500 to 1500 V between anode 224 and the cathode assembly 202 causes a discharge in the anode-cathode space. When working gas passes via the anode-cathode space, a discharge occurs with the formation of the plasma. The molecules of the gas are ionized. The ions are accelerated by the electric field E, and an ion beam IB is formed, which has a charge positive with respect to sputterable target 216. The ion beam IB itself has a positive potential with respect to object $OB_1$, i.e., with respect to the ground, since the object is grounded. This positive potential is about several hundred volts. On the other hand, cathode assembly 202 and sputterable target 216 are under a negative voltage of about −500V. Thus cathode 202/target 216 and ion beam IB function as a sputtering magnetron where positive ion beam IB functions as a virtual anode, transparent to electrons and thus being for them a "potential well". This causes magnetron sputtering with accumulation of electrons on the target surface. Ions formed in the magnetron discharge are accelerated toward sputterable target 216, bombard the target, and thus sputter its material.

The magnetron sputtering mode described above occurs simultaneously with the operation of the same apparatus as a pure ion source. In other words, as has been described above with reference to FIGS. 1 through 3, simultaneously with magnetron sputtering, ions, which pass through ion-emitting slit 214 in upper cathode plate 206 and slit 218 in sputterable target, are emitted toward object $OB_1$ as in a conventional ion source and impinge the surface of the object. In other words, the direction of ion-source emission coincides with the direction of sputtering, whereby the apparatus as a whole operates with an improved efficiency.

The combined ion-beam emission and magnetron sputtering significantly increases the life of high-velocity electrons and thus improves efficiency of ionization of the working medium. As a result, it becomes possible to reduce the working pressure in the magnetron sputtering discharge, decrease the discharge voltage, and improve quality of the film being deposited. The quality is improved because the residual gas is to a lower degree contaminated with sputtered particles.

The presence of the magnetron sputtering discharge also contributes to the efficiency of ionization of the working or reactive gaseous medium in the ion source, decreases potential on the anode, and thus the average energy of the electrons which bombard the film growing on the surface of the object. The current density of the ion beam is increased.

Furthermore, when the working medium is supplied to the anode cathode space, a pressure differential is generated between the area of the object and the area of sputtering, whereby conditions for maintaining the magnetron discharge are improved, the potential in the discharge is reduced, and the quality of the film growing on the object is further improved due to decrease of pressure in the vicinity of the object surface. In conventional sputtering magnetrons, working medium (gas) is fed into the vacuum chamber and the pressure near the sputterable target and near the substrate is the same.

The ratio between the flow of atoms from the sputterable target and the flow of accelerated ions from the ion source can be controlled by independently adjusting the potential of the target or the potential difference between the anode and the cathode/target.

Operation of the Apparatus of FIG. 5 in an Ion-Source Mode

When switch 209 is open, it disconnects lower cathode plate 204 from negative terminal 230b, and at the same time connects it to the ground at G3. In other words, the cathode and sputterable target 216 are grounded. If the apparatus of FIG. 5 is initiated under this condition, it will work as a conventional ion source of the type described with reference to FIGS. 1 through 3. This is because in this case the sputtering magnetron part of the apparatus will not work since the sputterable target will merely be a part of the grounded cathode.

Figure 6:
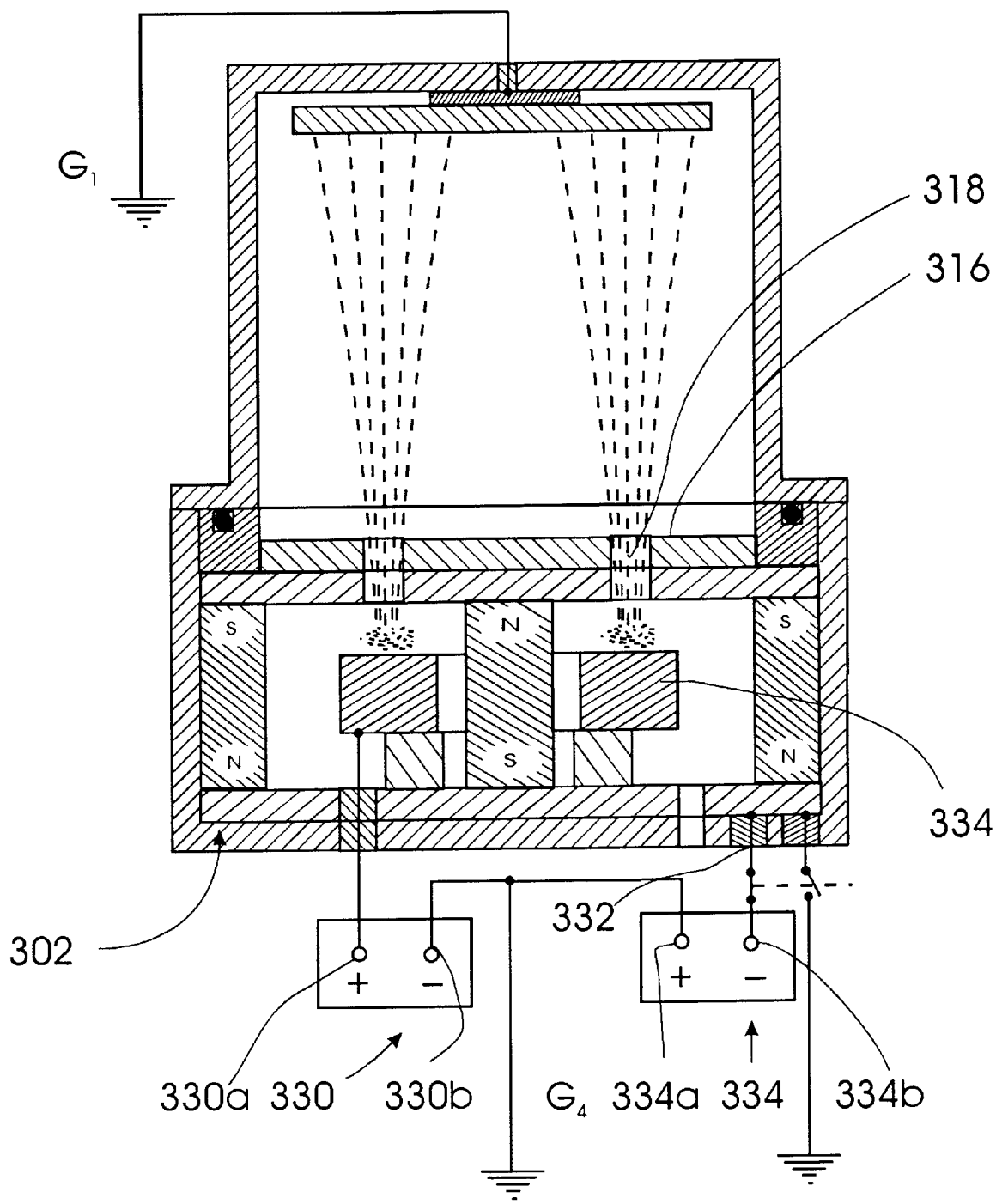
FIG. 6 is a schematic view of an apparatus of the second embodiment of the invention with the anode power supply unit having grounded negative terminal

FIG. 6—Detailed Description of Apparatus of the Invention with the Anode Power Supply Unit Having Grounded Negative Terminal The apparatus of this embodiment differs from the apparatus of FIG. 5 only by electrical connections of the anode and the cathode, which, however, determines different modes of adjustment of the operation parameters of the apparatus. Parts and units of the apparatus of FIG. 6 identical to those of the apparatus of FIG. 5 will be designated by the same reference numerals with an addition of 100. For example, apparatus of FIG. 6 has an anode 334, cathode assembly 302, an ion-emitting slit 318, etc.

In this apparatus, a positive terminal 330a of a power source 330 is connected to an anode 334 to apply to the anode a positive voltage of 500 to 1000V. A negative terminal 330b of power source 330 is grounded at G4 and is also connected to a positive terminal 334a of a power source 334, whereas a negative terminal 334b of power source 334 is connected to a lower plate 304 of cathode assembly 302 via an electric feedthough 332. Similar to the embodiment of FIG. 5, cathode and sputterable target 316 can be grounded via a switch 309 for operation in an ion-source mode.

The apparatus of this embodiment operates in the same manner as the one shown in FIG. 5.

Figure 7:
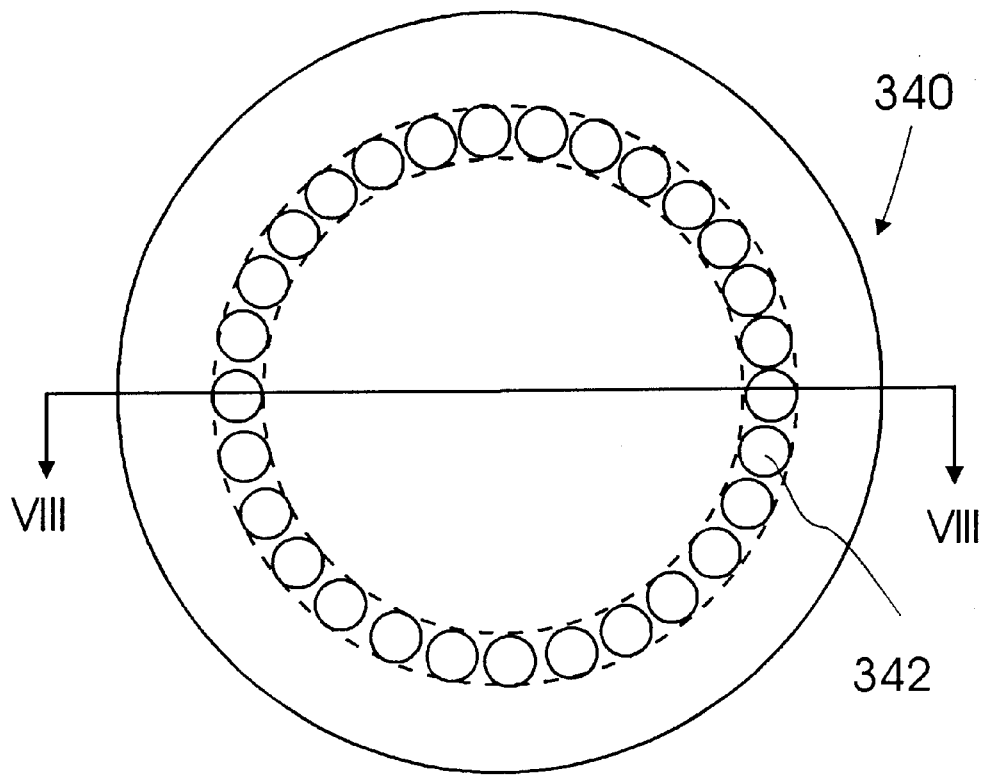
FIG. 7 is a fragmental top view of the sputterable perforated target with perfortions over the ion-emitting slit.
Figure 8:
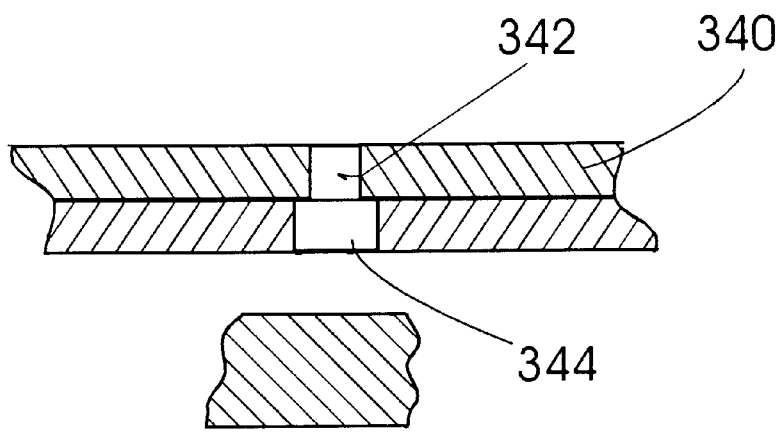
FIG. 8 is a sectional view along line VII—VII of FIG. 7.

FIGS. 7–10—Embodiments of the Apparatus of the Invention with Perforated Target FIG. 7 and 8 illustrate an embodiment of the apparatus of the invention which differs from the embodiments of FIG. 5 and 6 in that, instead of a closed-loop slit (such as slits 218 and 318), a sputterable target 340 has a plurality of openings 342 which are arranged along the contour of a closed-loop ion-emitting slit 344 of a cathode. FIG. 7 is a fragmental top view of the apparatus of the invention, and FIG. 8 is a sectional view along lines VIII—VII of FIG. 7. The remaining parts of the apparatus are the same as in the embodiments described with reference to FIGS. 5 and 6.

The apparatus of the embodiment with the perforated sputterable target operates in the same manner as described above, with the difference that the provision of holes in the sputterable target will improve uniformity of treatment and even intensify the sputtering because a plurality of ion beams act as virtual anodes spatially distributed with respect to the cathode.

Figure 9:
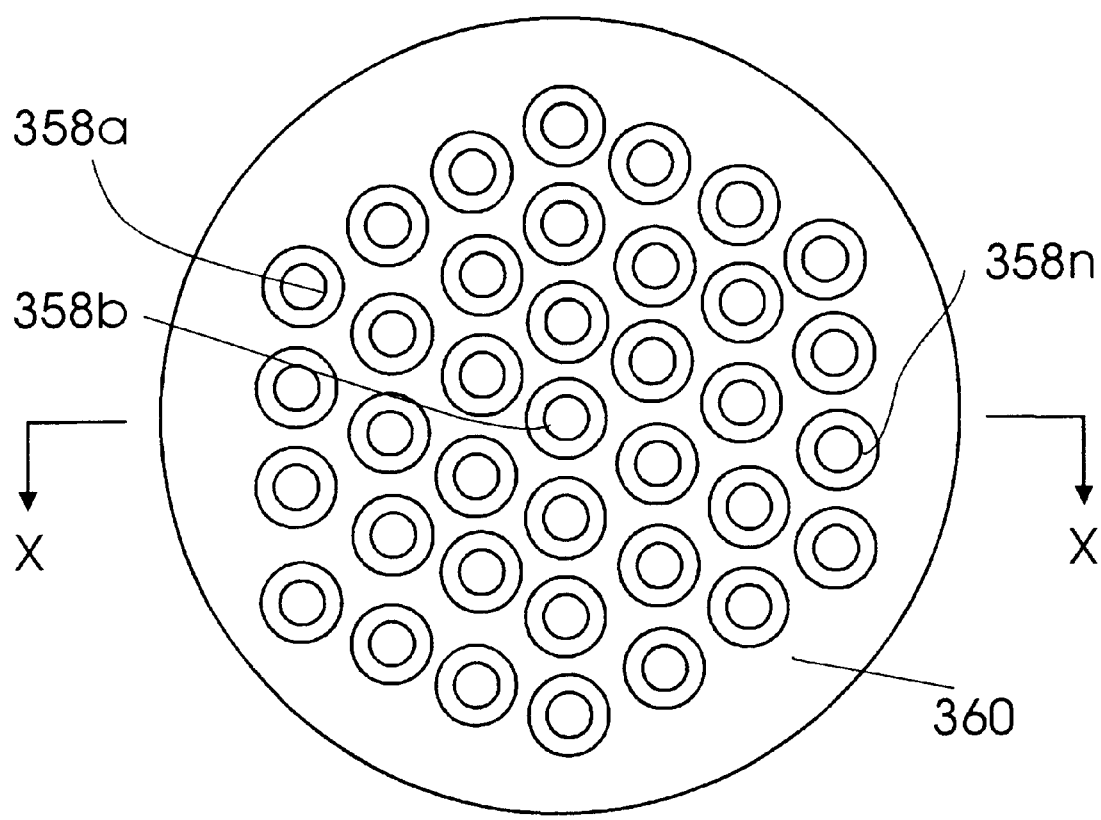
FIG. 9 is a fragmental top view of a sputterable target in a combined multipleell type ion-beam and magnetron-sputtering source of the invention.
Figure 10:
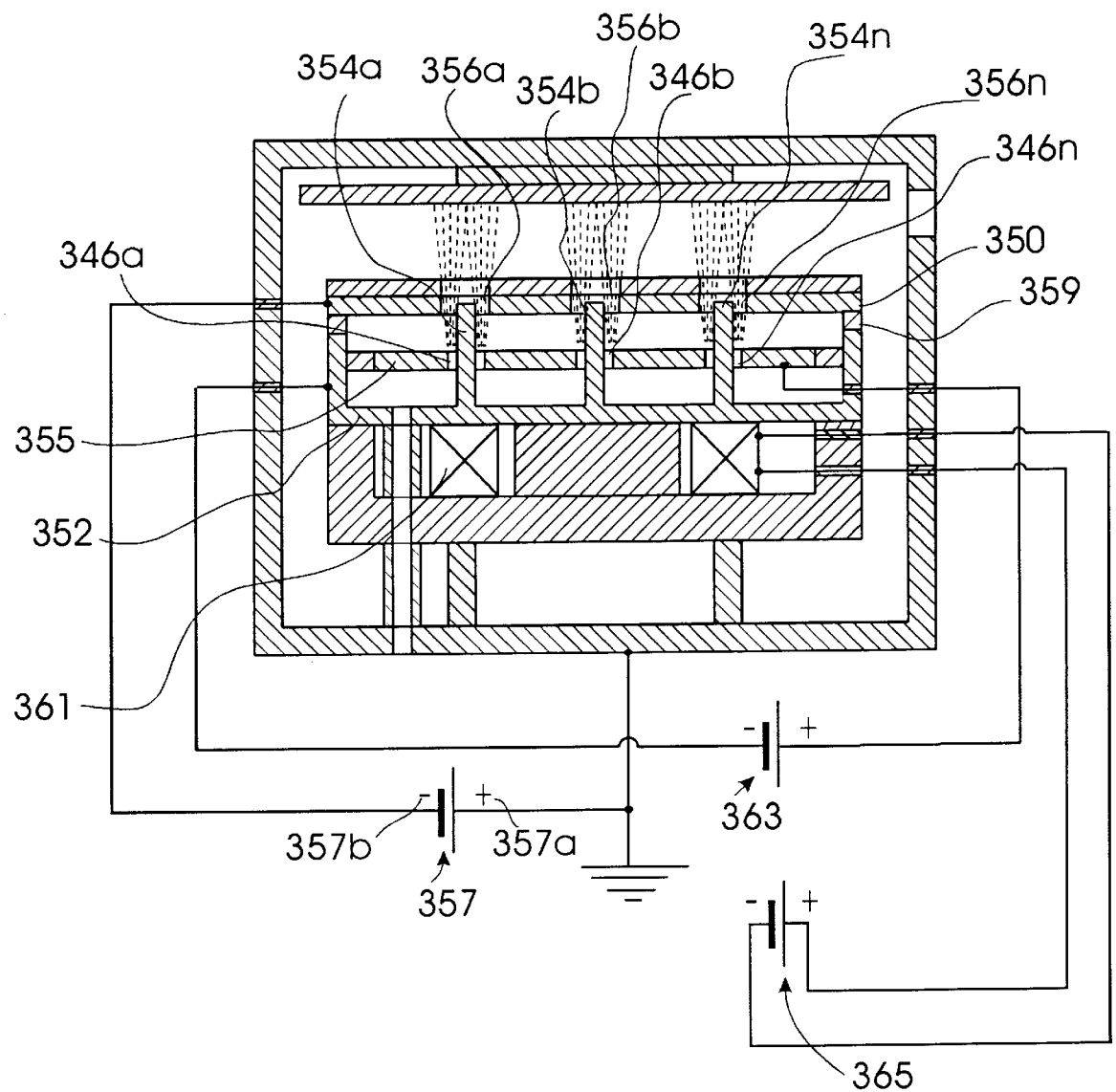
FIG. 10 is a sectional view along lines X—X of FIG. 9.

The embodiment of FIGS. 9 and 10 is similar to the one shown in FIG. 7 and 8. FIG. 9 is a fragmental top view of the apparatus, and FIG. 10 is a sectional view along lines X—X of FIG. 9. In this embodiment, a cathode assembly consists of an upper cathode plate 350, a lower cathode plate 352, and rods 354a, 354b, . . . 354n of a magnetoconductive material such as Fe which extend from lower cathode plate 352 to upper cathode plate 350 via perforations 346a, 346b, . . . 346n formed in an anode 355. Perforations 356a, 356b, . . . 356n which are coaxial with perforations 346a, 346b, . . . 346n of the anode are also formed in upper cathode plate 350 and function as ion-emitting slits. Similarly, perforations 358a, 358b, . . . 358n are formed in a sputterable target 360 (FIG. 9). Perforations of the sputterable target are coaxial with those of the anode and upper cathode plate. Rods 354a, 354b, . . . 354n do not contact the walls of anode perforations 346a, 346b, . . . 346n and do not reach openings 356a, 356b, . . . 356n of the upper cathode plate.

Upper cathode plate 350 is connected to a negative terminal 357b of direct current source 357, the positive terminal of which is grounded. Lower cathode plate 352 is isolated from upper cathode plate 350 by an insulation pads 359 and is grounded. An electromagnetic coil 361 is placed under lower cathode plate 352 for generating a magnetic field across ion-emitting slits 356a, 356b, . . . 356n. Electromagnetic coil 361 is energized by a power source 365. Positive potential is applied to anode from direct current power source 363.

As can be seen from FIGS. 9 and 10, the ion-source/ sputtering magnetron apparatus of this embodiment does not have a single closed-loop ion-emitting slit and similarly shaped single slit in the sputterable target, but rather has a plurality of miniature units consisting of ion beam sources combined with miniature sputtering magnetron. These units are uniformly distributed over the entire cross section of the apparatus (see FIG. 9). Such a construction not only provides more uniform distribution of ion beams and flows of sputtered particles, but also intensifies the treatment for the same reasons as have been described in connection with the embodiment of FIGS. 7 and 8.

Figure 11:
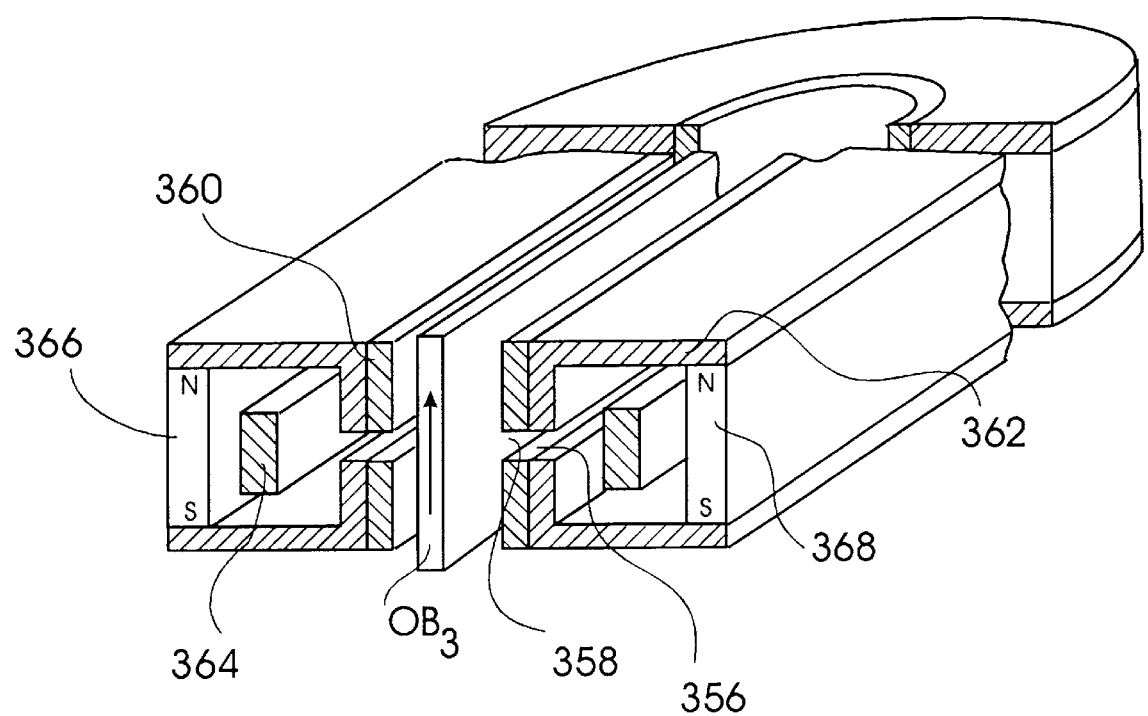
FIG. 11 is a fragmental three-dimensional view of the combined sputtering magnetron/ion source apparatus for simultaneously treating both sides of an object.
Figure 12:
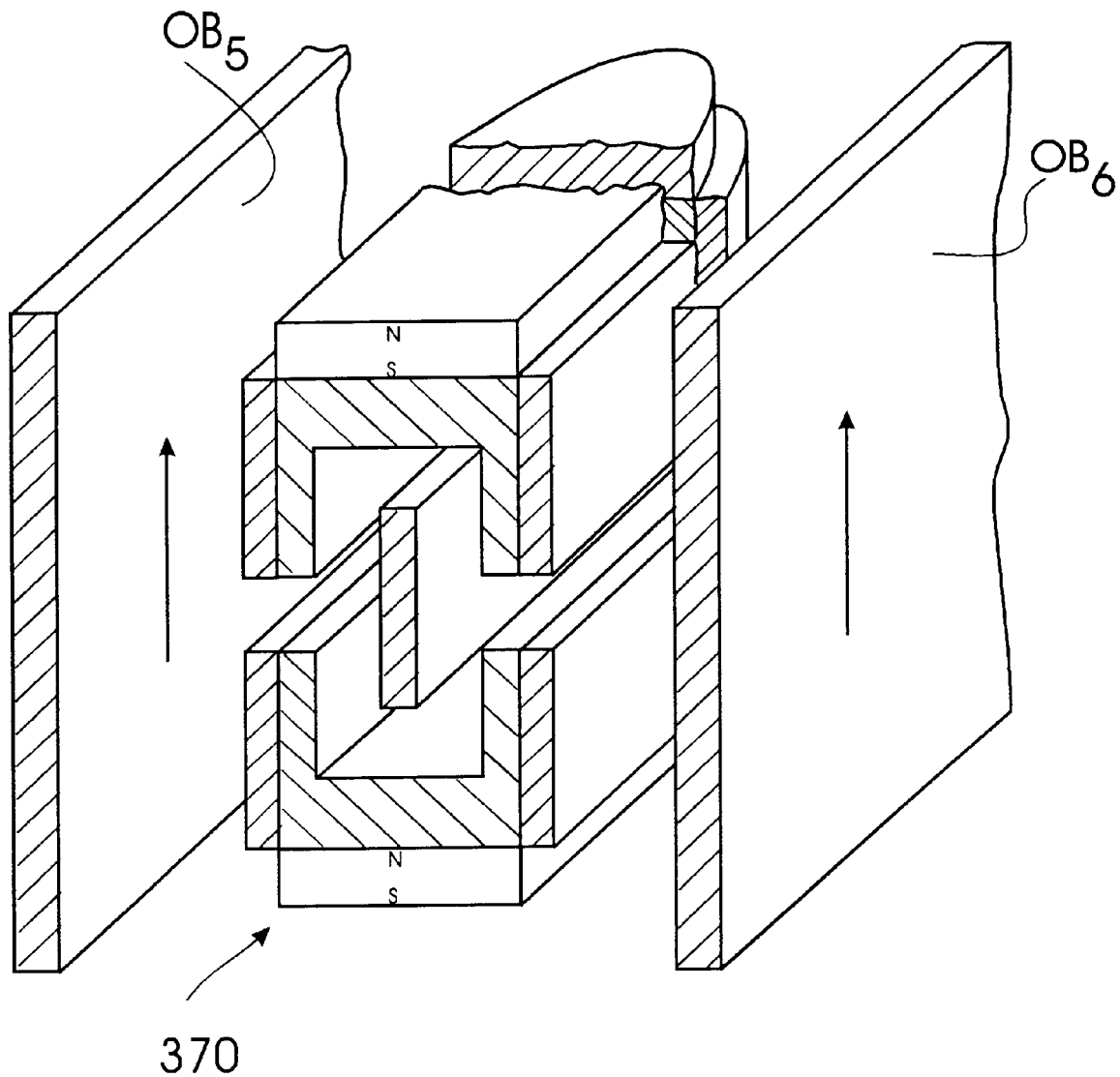
FIG. 12 is a fragmental three-dimensional view of the combined sputtering magnetron/ion source apparatus for simultaneously treating two objects.

FIGS. 11 and 12—Embodiments with Direction of Drift of Electrons Coinciding with the Direction of Sputtering and Beam Emission FIGS. 11 and FIG. 12 illustrate incorporation of sputtering magnetrons into ion beam sources of the type described in our U.S. pending patent application Ser. No. 09/161,581 of September 1998.

In other words, FIG. 11 is a fragmental three-dimensional view of the combined sputtering magnetron/ion source apparatus having direction of drift of electrons coinciding with the direction of emission of the ion beam, i.e., radially inwardly toward an object, i.e., a wafer substrate $OB_3$. It is understood, that in accordance with the construction of the ion beam source described in the aforementioned patent application, an ion-emitting slit 356 has a closed loop configuration, as well as a slit 358 which is aligned with slit 356 and is formed in a sputterable target 360 which lines the facing inner surfaces of the a cathode 362. Reference numeral 364 designated an anode, and 366 and 368 are permanent magnets.

The apparatus operates in the same manner as described above and coats and treats both sides of substrate $OB_3$ simultaneously. The housing of the vacuum chamber which encloses the entire unit is not shown.

FIG. 12 illustrates an apparatus 370 similar to the one shown in FIG. 11 and is characterized by having ion beams and flows of sputterable particles directed in a radially outward direction from the apparatus to a couple of objects $OB_5$ and $OB_6$ which are located on both sides of the apparatus and are treated simultaneously, on one side each.

The apparatus of the invention makes it possible to combine processes of deposition of films onto an object by means of magnetron sputtering of the target material with processes of treatment (activation) of the growing film with ion beam of inert (argon) or reactive (oxygen, nitrogen) gases. The apparatus of the invention also makes it possible to form coatings of composite materials with different proportions of components, e.g., by dispersing silicon and simultaneously treating the surface with a beam of ions of carbon for the formation of silicon carbide, or for deposition of alternating layers of both materials onto a substrate with any ratios of the components in the interface areas. In other words, the apparatus of the invention widens technological possibilities for the formation of essentially new materials and structures.

Rate of film deposition by magnetron sputtering of the target material depends, under conditions of constant magnetic field, on the discharge voltage and current.

Parameters of the ion beam (energy of ions, shape of the beam, and composition of the beam) depend on the voltage on the anode and on the geometry of the ion-optical system (i.e., a ratio between an anode-cathode/target distance and the width of the ion-emitting slit).

Figure 13:
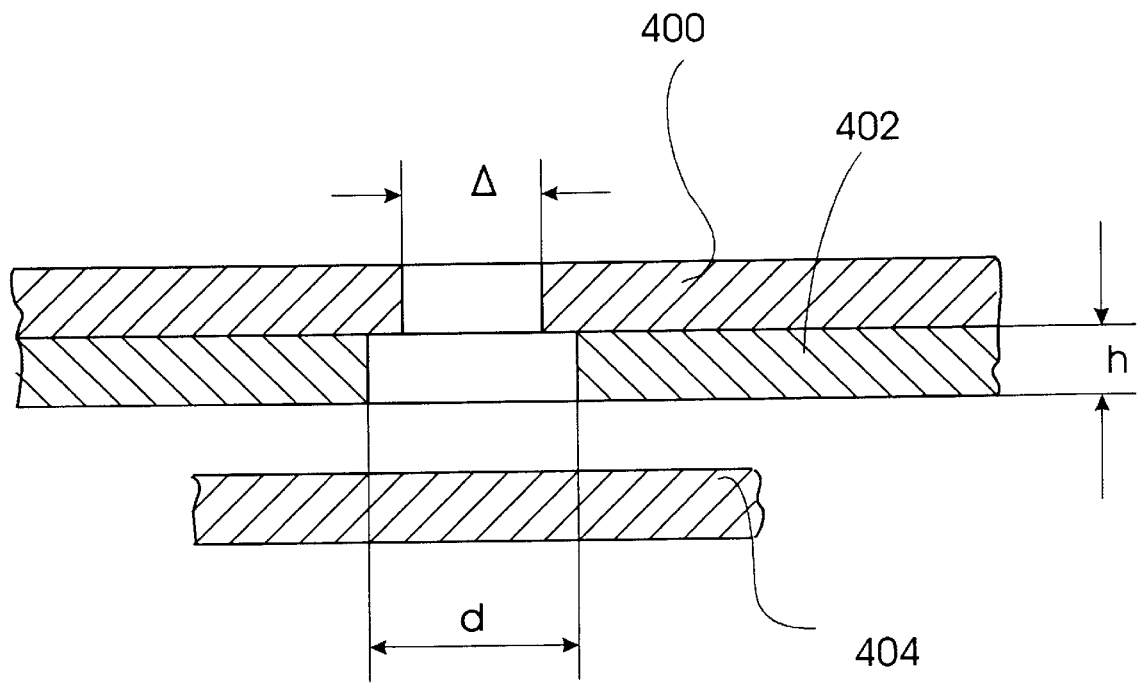
FIG. 13 shows relations between dimensions of the ion-accelerating gap and width of the ion-emitting slit.

By changing the width of the ion-emitting slit and the anode-cathode distance and by changing the potential on the anode or the potential difference between the components of the cathode-target assembly, i.e., by scanning the ion beam, it becomes possible to control the parameters of the ion-beam treatment process. A ratio between the ion-beam current and the flow of sputterable particles deposited onto the object can be adjusted by changing the magnitude of gaps d and Δ shown in FIG. 13, where 400 is a target, 402 is a cathode, and 404 is an anode. If Δ is reduced, the surface area of the sputterable target 400 is increased, the flow of ions which bombard the target grows, and the flow of the ions which impinge the surface of the object is reduced. Δ can vary from 0 to d. With Δ=0, the apparatus will operate purely as a sputtering matron, i.e., without the ion beam. With Δ>d, the apparatus nay sputter the material of the cathode (Fe) thus contaminating the deposited film. It should be noted that in the apparatus of the invention the sputterable target can be made of a magnetic material.

Figure 14:
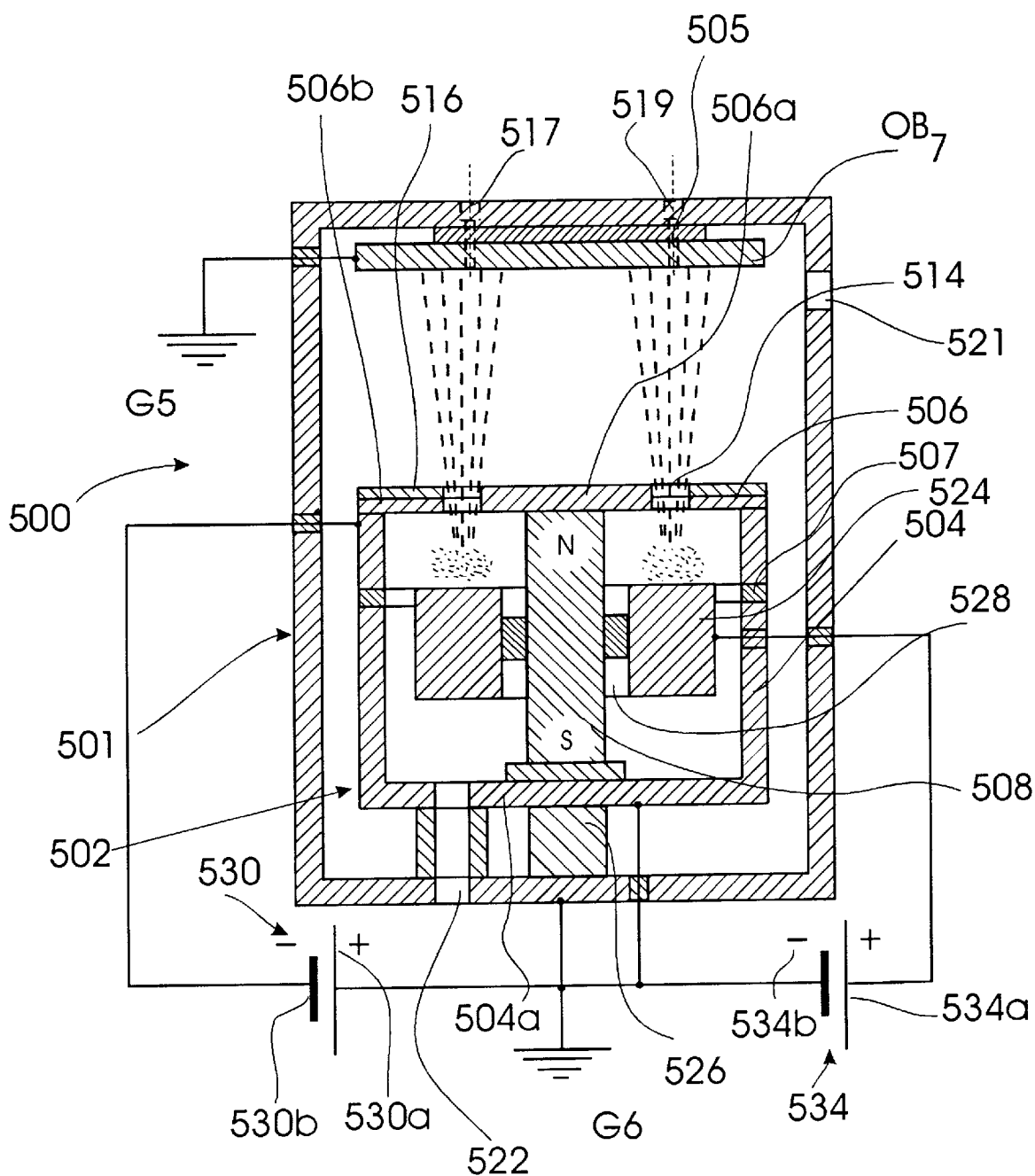
FIG. 14 is s schematic sectional view illustrating an embodiment of the apparatus of the invention with a ring-like target on the peripheral part of the cathode.

FIG. 14—Embodiment of the Apparatus of the Invention with a Ring-Like Target on the Peripheral Part of the Cathode FIG. 14 illustrates another embodiment of a combined sputtering magnetron/ion beam source 500 of the present invention with a ring-like target. In general this device is similar to those shown in FIGS. 5 and 6. More specifically, the apparatus has a sealed and evacuated box-like housing 501 made of a nonmagnetic and nonconductive material such as ceramic. A cathode assembly, which in general is designated by reference numeral 502, is placed inside housing 501 and consists of two parts, i.e., a cup-shaped part 504 having it open side facing upward and a plate-like part 506 placed onto the open top of part 504 via an insulating ring 507, e.g., of a dielectric material. Parts 504 and 506 are made of a magnetoconductive material such as Armco steel. Cathode plate 506 has a closed-loop ion-emitting slit 514 which may have the same circular or oval shape as the ion-emitting slits of devices of the previous embodiments. An ion-emitting slit 514 divides plate 506 into a central or inner cathode part 506*a* and an outer cathode part 506*b*. A permanent magnet 508 is placed between inner part 506*a* and a bottom 504*a* of cup-shaped cathode part 504. Northern poles N of the magnet is in contact with inner part 506*a* and Southern poles S is in contact with bottom 504*a*.

A ring-shaped plate or target 516 of a sputterable material such as aluminium, titanium, carbon, an alloy such as permaloy, etc., is placed onto outer cathode part 506*b* and is firmly attached to it for tight electrical contact, e.g., by bolts (not shown).

An object $OB_7$ is fixed inside housing 501, e.g., by bolts 517 and 519. As has been mentioned above, it is ached to an object holder 505 located in upper part 503 above sputterable target 516. Object $OB_7$ and holder 505 can be grounded at $G_5$ and can be electrically isolated from housing 501 or the housing can be made of a dielectric material.

A working medium is injected into housing 501 via a gas supply channel 522 which passes through the bottom of housing 501 and bottom 504*a* of cathode part 504. The working medium is evacuated from housing 501 via an evacuation passage 521 by means of a vacuum pump (not shown).

An anode 524 is supported inside the cathode assembly 502 between upper cathode plate 506 and lower cathode plate part 504 by a block 526 of non-magnetic dielectric material, such as ceramic. Anode 524 has a central opening 528 through which magnet 508 passes without physical contact, with its anode 524.

The apparatus of FIG. 14 has two direct current power sources, i.e., a power source 530 and a direct current power source 534. A positive terminal 530*a* of power source 530 is connected to cathode part 504 and is grounded at G6. It is also connected to a negative terminal 534*b* of power source 534. A negative terminal 530*b* of power source 530 is connected to outer cathode part 506*b*, whereas a positive terminal 534*a* of power source 543 is connected to anode 524. Appropriate electrical connections from outside sources to the parts of the apparatus located inside housing 501 are performed by means of electrical feedthrough of the type mentioned above.

The positive potential on anode 524 should be within the range of 200 to 3000V, and the negative potential on outer cathode part 506*b*, and hence on target 516, should be around 500 V. It is understood that these values are given as examples and do not limit the scope of voltage ranges on the anode and cathode.

The apparatus of FIG. 14 operates in the same manner as the one described, e.g., with reference to FIG. 5, with the only difference that sputtering will occur only from the peripheral parts of the cathode assembly, i.e., from ring-shaped target 516 which is under a high negative potential with respect to the grounded inner part 506*a* of the cathode.

Figure 15:
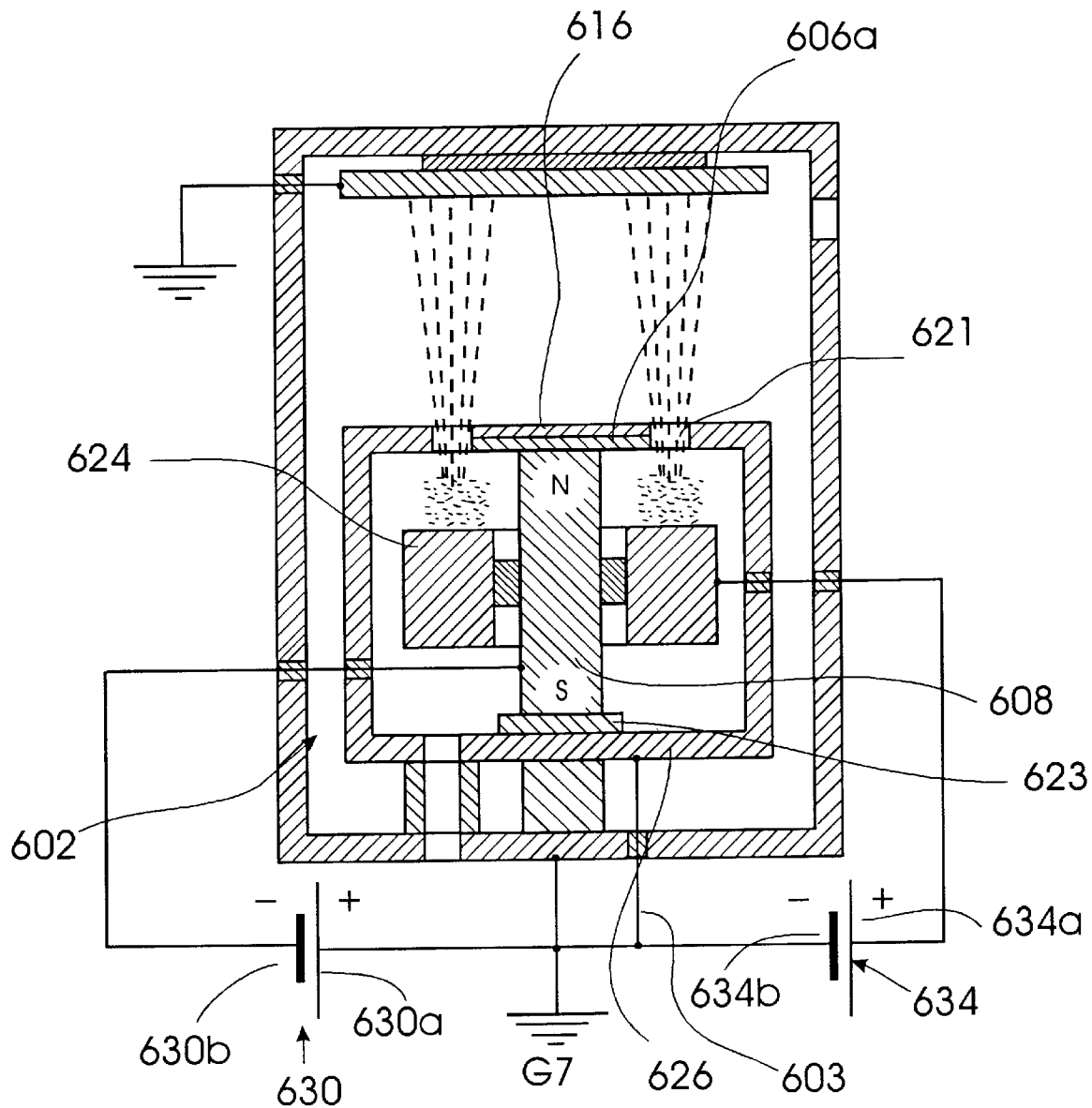
FIG. 15 is a schematic sectional view illustrating an embodiment of the apparatus of the invention with a disk-like target in the central part of the cathode.

FIG. 15—Embodiment of the Apparatus of the Invention with a Disk-Like Target in the Central Part of the Cathode The apparatus of FIG. 15 is similar to the one of FIG. 14 and differs from it in that the terminals of the direct current power sources have different electric connections. Parts and units of a combined sputtering-magnetron/ion source 600 of this embodiment which are similar to those of FIG. 14 will be designated by the same numeral numbers as in FIG. 14 with an addition of 100, and their description will be omitted.

In the embodiment of FIG. 15, a cathode assembly 602 has a box-like shape with an inner part 606*a* isolated from the remaining part of the cathode assembly by a closed-loop ion-emitting slit 621 and an isolation pad 623 of a dielectric material placed between the lower end of a permanent magnet 608 and a bottom-626 of cathode assembly 602.

A positive terminal 630*a* of a power source 630 is grounded at G7 and is connected to a negative terminal 634*b* of a power source 634. A negative terminal 630*b* of power source 630 is connected to magnet 608 and hence to inner cathode part 606*a*. This means that it is also connected to a disk-like sputterable target 616 which covers only inner cathode part 606*a* maintained under a high negative voltage of about 500 V with respect to the remaining surrounding part of the upper plate of cathode assembly 602 which is grounded by means of a conductor 603. A positive terminal 634*a* of power source 634 is connected to anode 624.

The apparatus of FIG. 15 operates in the same manner as the one shown in FIG. 14, with the difference that disk-like sputterable target 606*a* that covers only the inner part of the cathode will be sputtered.

Figure 16:
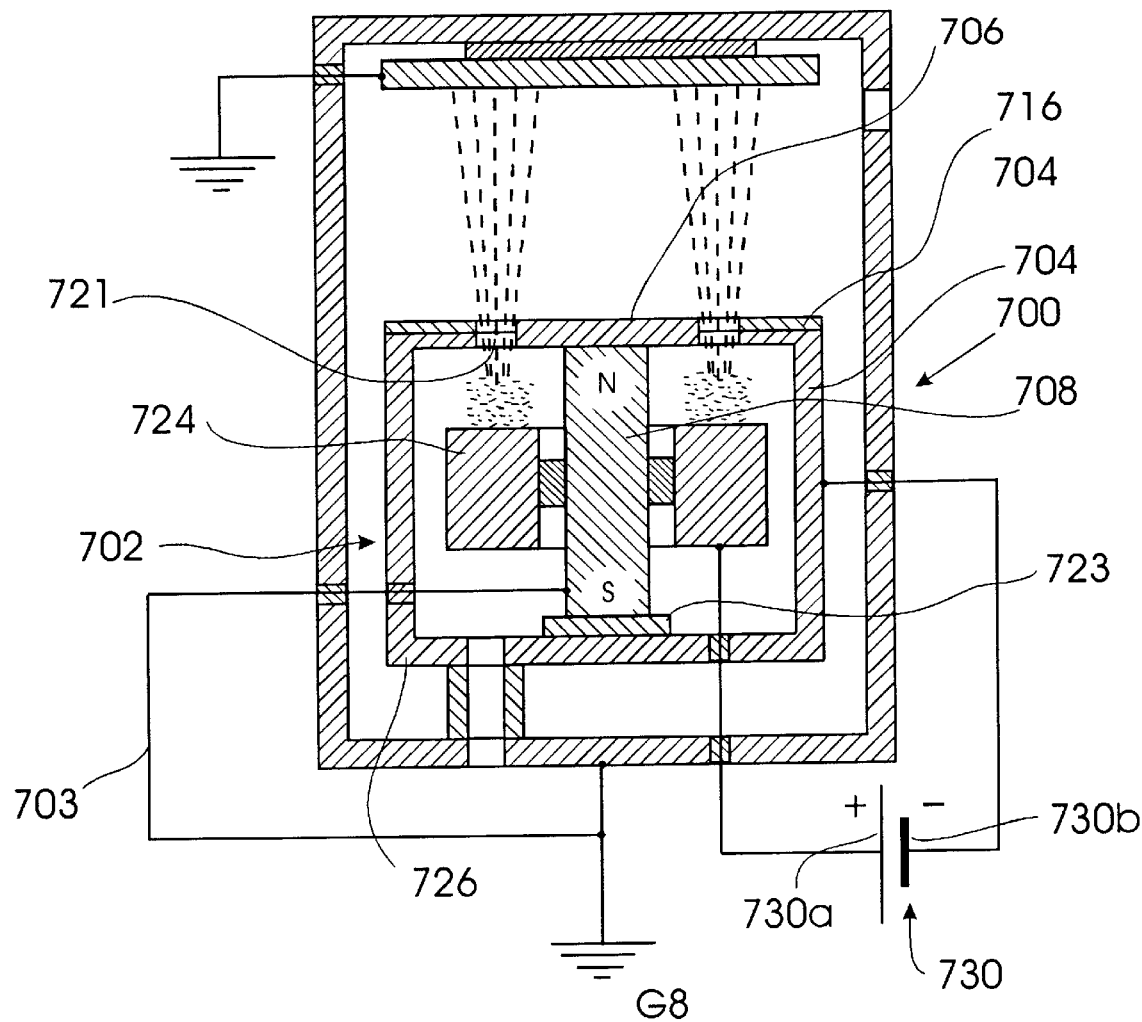
FIG. 16 is a schematic sectional view illustrating an embodiment of the sputtering-magnetron/ion source with a single power source and with a ring-shaped target on the peripheral part of the cathode.

FIG. 16—Embodiment of the Sputtering-Magnetron/Ion Source with a Single Power Source and with a Ring-Shaped Target on the Peripheral Part of the Cathode The apparatus of FIG. 16 is similar to the one of FIG. 15 and differs from it in that a single direct current power source 730 is used. Parts and units of a combined sputtering magnetron/ion source 700 of this embodiment which are similar to those of FIG. 15 will be designated by the same numeral numbers as in FIG. 14 with an addition of 100, and their description will be omitted.

In the embodiment of FIG. 16, a positive terminal 730*a* of power source 730 is connected to an anode 724. A negative terminal 730*b* of the power source is connected to an outer part 704 of the cathode. An inner part 706*a* of a cathode assembly 702 is grounded at G8 via a conductor 703 and magnet 708. Inner part 706*a* is isolated from the remaining part of cathode assembly 702 by an ion-emitting slit 721 and an isolation pad 723 between magnet 708 and a bottom 726 of outer cathode part 704.

Thus the apparatus of FIG. 16 has grounded inner part 706*a* and a negatively-charged outer part 704 of the cathode, and hence negatively-charged ring-shaped target 716 which is sputtered due to interaction with an ion beam positively charged with respect to sputterable target 716.

Figure 17:
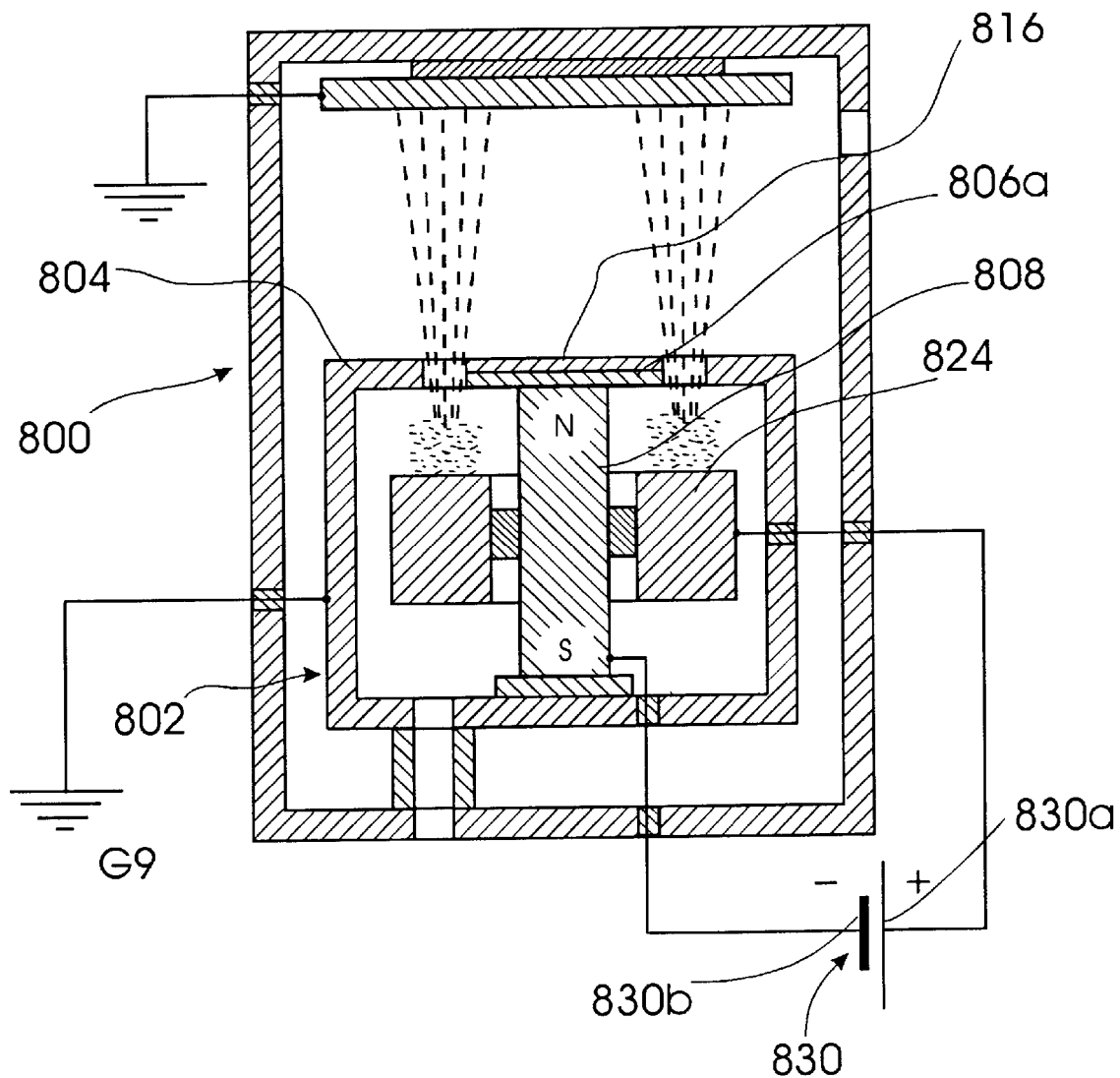
FIG. 17 is schematic sectional view illustrating an embodiment of the sputtering-magnetron/ion source with a single power source and with a disk-shaped target on the inner part of the cathode.

FIG. 17—Embodiment of the Sputtering-Magnetron/Ion Source with a Single Power Source and with a Disk-Shaped Target on the Inner Part of the Cathode The apparatus of FIG. 17 is similar to the one of FIG. 16 and differs from it in that a disk-like sputterable target is placed onto the inner part of the cathode which is under a potential negative with respect to the grounded outer cathode part. Parts and units of a combined sputtering-magnetron/ion source 800 of this embodiment which are similar to those of FIG. 16 will be designated by the same numeral numbers as in FIG. 14 with an addition of 100, and their description will be omitted.

In the embodiment of FIG. 17, a positive terminal 830a of power source 830 is connected to an anode 824. A negative terminal 830b of the power source is connected to a magnet 808 and hence to a sputterable target 816 placed onto part 806a. A surrounding or outer part 804 of cathode assembly 802 is grounded at G9.

Thus the apparatus of FIG. 17 has grounded outer part 804 and negatively-charged inner part 806a and hence disk-like sputterable target 816 which is sputtered due to interaction with an ion beam positively charged with respect to sputterable target 816.

Figure 18:
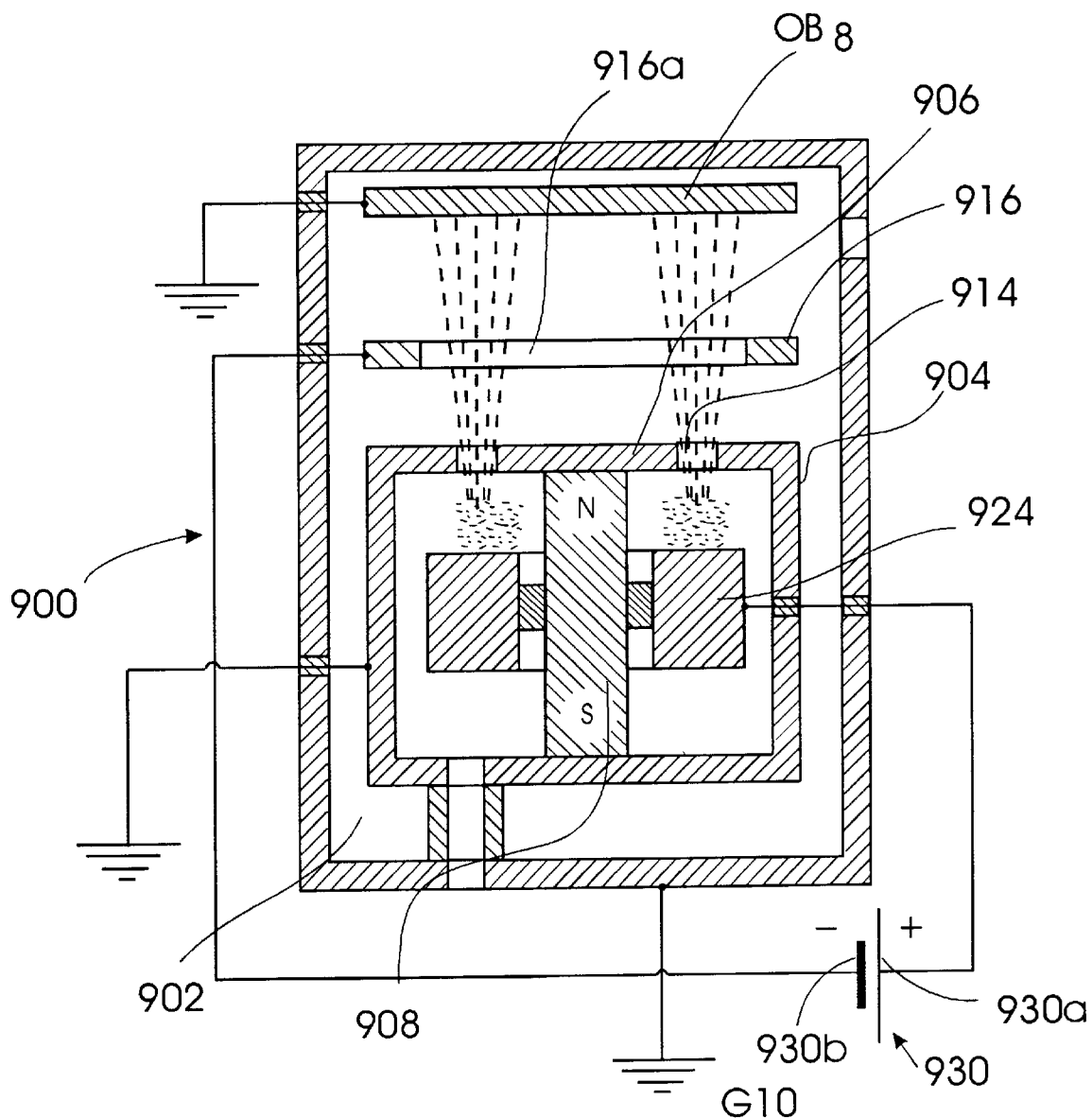
FIG. 18 is schematic sectional view illustrating an embodiment of the sputtering-magnetron/ion source with a single power source and a ring-shaped target separated from the cathode.

FIG. 18—Embodiment of the Sputtering-Magnetron/Ion Source with a Single Power Source and a Ring-Shaped Target Separated from the Cathode The apparatus of FIG. 18 is similar to the one of FIG. 17 and differs from it in that a ring-shaped target is separated from the cathode.

Parts and units of a combined sputtering-magnetron/ion source 900 of this embodiment which are similar to those of FIG. 17 will be designated by the same numeral numbers as in FIG. 18 with an addition of 100, and their description will be omitted.

In the embodiment of FIG. 18, a ring-shaped sputterable target 916 is separated from a cathode assembly 902 and is located above cathode assembly 902 and an object OB$_8$. In order not to obstruct the passage of the ion beam, ring-shaped target 916 has an opening 916a of a diameter greater than the dimensions of an ion-emitting slit 914. A positive terminal 930a of power source 930 is connected to an anode 924. A negative terminal 930b of the power source is connected to sputterable target 916 and to cathode assembly 902, whereas central part 906 of the cathode is grounded via a magnet 908.

Thus the apparatus of FIG. 18 has grounded inner part 906a and negatively-charged outer part 904 and hence sputterable target 916 located between cathode assembly 902 and object OB$_8$.

Figure 19:
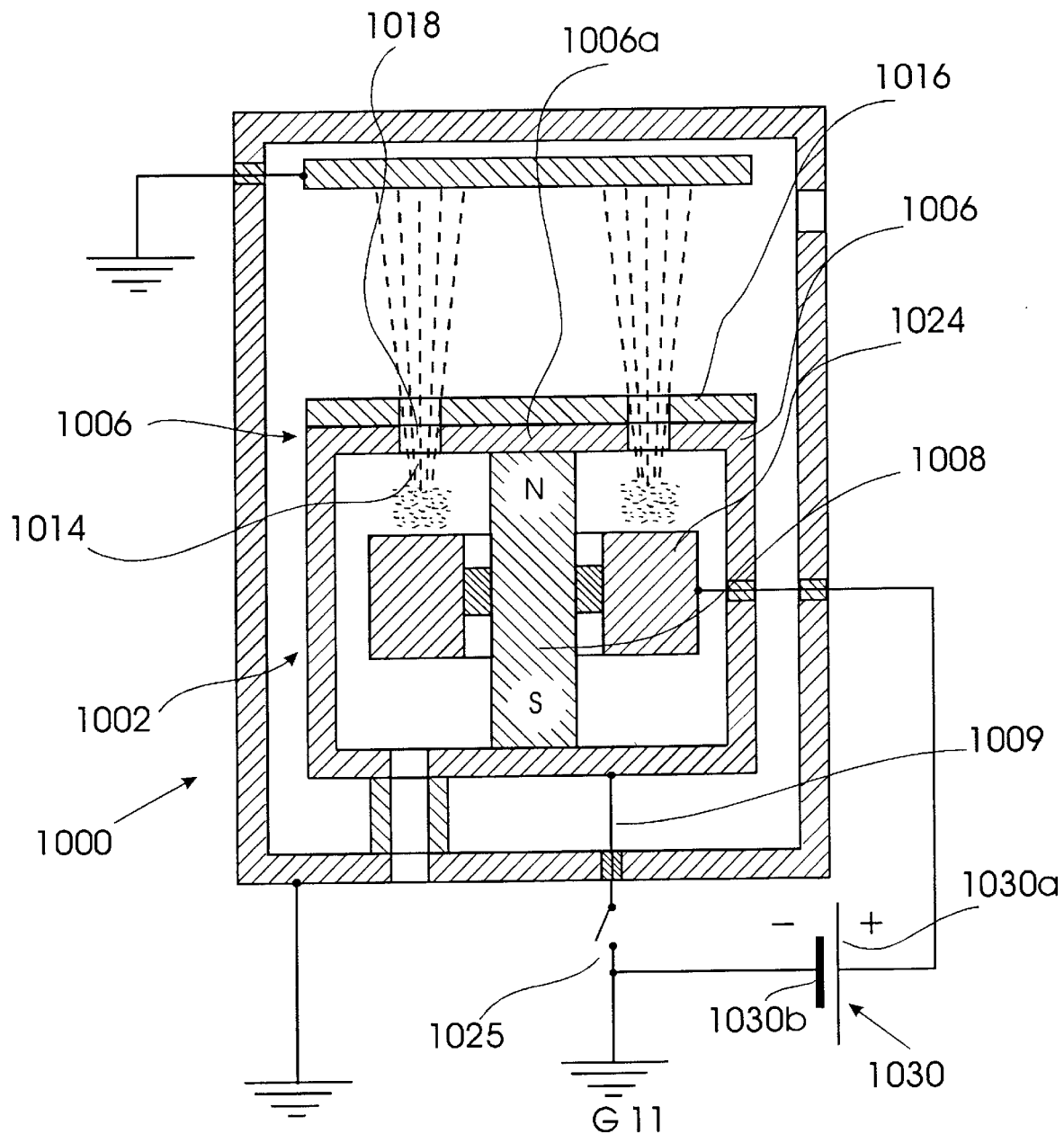
FIG. 19 is a sectional view illustrating an embodiment of the sputtering-magnetron/ion source with a cathode switch-able between the ground and the negative potential on the inner cathode part.

FIG. 19—Embodiment of the Sputtering-Magnetron/Ion Source with a Cathode Switchable between the Ground and the Negative Potential on the Inner Cathode Part The apparatus of FIG. 19 is similar to the one of FIG. 18 and differs from it in that the target is switchable between the ground and a potential on the inner part of the cathode negative with respect to the outer part.

Parts and units of a combined sputtering-magnetron/ion source 1000 of this embodiment which are similar to those of FIG. 18 will be designated by the same numeral numbers as in FIG. 18 with an addition of 100, and their description will be omitted.

In the embodiment of FIG. 19, a sputterable target 1016 covers the entire upper plate 1006 of a cathode assembly 1002. Similar to embodiments of FIG. 5 and FIG. 6, a target has a closed-loop slit 1018 which is aligned with a closed-loop ion-emitting slit 1014 in upper cathode plate 1006. A positive terminal 1030a of power source 1030 is connected to an anode 1024. A negative terminal 1030b is connected to both parts of the cathode, i.e., to an inner part 1006a via a magnet 1008 and to an outer part 1006b via a conductor 1009. A switch 1025 is installed between negative terminal 1030b of the power source and ground G11.

When the power source is connected via switch 1025 to ground G11, the entire cathode and target 1016 are grounded, so that apparatus 1000 work as a conventional ion source without magnetron sputtering. When the power source is disconnected from ground G11 by switch 1025, the entire cathode and target are charged negatively with respect to the positively charged ion beam, so that the device works as a sputterable magnetron.

Thus it has been shown that the invention provides a sputtering apparatus which is simple in construction, easy to manufacture, small in dimensions, operates with an increased efficiency of sputtering, allows for treating objects of various geometrical configurations, combines a sputtering magnetron and an ion source in a single device and therefore does not need separate power supply sources, gas delivery systems, etc. for a sputtering magnetron and an ion source. The invention also provides a method for combined treatment of objects with sputtering magnetron and ion-beam source wherein the sputtering direction of the magnetron coincides with that of the ion source.

Although the invention has been shown and described with reference to specific embodiments, it is understood that these embodiments were given only as examples and that any changes and modifications are possible, provided they do not depart from the scope of the appended claims. For example, the apparatus may be used without replaceable sputterable targets and the cathode itself can be made of a sputterable material and used as a cathode and as a sputterable target at the same time, or the sputterable target plates can be permanently attached to the cathode, e.g., by soldering. The sputterable targets may have shapes different from those shown in the drawings. They can be assembled from pieces of different materials. Anodes, cathodes, and targets can be provided with positive cooling means. Permanent magnets can be replaced by electromagnetic coils. The principle of the invention with combination of ion beam coaxial with the flow of sputterable particles is applicable not only to cold-cathode type ion sources with electrons drifting in the crossed electric and magnetic field, but to ion-beam sources of other types where the ion beam can function as a virtual anode. The openings in the multiple-cell apparatus may have oval or square shape and may have a specific distribution patternt.

What is claimed is:

1. A combined sputtering magnetron/ion beam source for treating an object comprising:

an ion beam source for emitting an ion beam in a direction toward said object, said ion beam source having a cathode, an anode, and at least one ion-emitting slit in said cathode;

a planar sputtering magnetron having a target of a sputterable material for sputtering particles of said material, said magnetron having a direction of sputtering of said sputterable material which is coaxial with said direction toward said object, so that said object is simultaneously treated with said ion beam and with said particles of said sputterable material.

2. The combined sputtering magnetron/ion beam source of claim 1, further comprising:

a sealed housing in which said ion beam source and said planar sputtering magnetron are located, said sealed housing being connected with a vacuum source and is evacuated, said sealed housing having an opening for connection to a source of a gaseous working medium required for operation of said ion beam source, said object being grounded and being located above said at least one ion-emitting slit.

3. The combined sputtering magnetron/ion beam source of claim 2, wherein said ion-beam source is a cold-cathode type ion beam source having electrons drifting in crossed electric and magnetic fields, said combined planar sputtering magnetron/ion beam source further comprising:

a first direct current electric power source with a first positive terminal and a first negative terminal and a second direct current power source having a second positive terminal and a second negative terminal, said first positive terminal being connected to said anode, and said first negative terminal being connected to said cathode and said target of a sputterable material, said housing being electrically isolated from said cathode and said anode, said second positive terminal being grounded, and said second negative terminal being connected to said first negative terminal, said target of a sputterable material having at least one opening aligned with said at least one ion-emitting slit for passing said ion beam from said ion-beam source through said planar sputtering magnetron toward said object.

4. The combined sputtering magnetron/ion beam source of claim 3, further comprising switching means for switching connection of said cathode and target between said first direct current electric power source and ground.

5. The combined sputtering magnetron/ion beam source of claim 3, further comprising means for releasably connecting said target of a sputterable material to said cathode.

6. The combined sputtering magnetron/ion beam source of claim 5, wherein said cathode comprises a first part which is releasably engaged to and from said target of a sputterable material, and a second part spaced from said first part, said combined sputtering magnetron/ion beam source further comprising a magnetic field generation means which comprises at least one permanent magnet located between said first part and said second part in a magnetoconductive relationship therewith to generate a magnetic field that passes through said at least one ion-emitting slit.

7. The combined sputtering magnetron/ion beam source of claim 2, further comprising:

a first direct current electric power source with a first positive terminal and a first negative terminal and a second direct current power source having a second positive terminal and a second negative terminal, said first positive terminal being connected to said anode, and said first negative terminal being grounded and being connected to said second positive terminal, said second negative terminal being connected to said cathode and said target of a sputterable material, said housing being electrically isolated from said cathode and said anode, said second positive terminal being grounded, said target of a sputterable material having at least one opening aligned with said at least one ion-emitting slit for passing said ion beam from said ion-beam source through said planar sputtering magnetron toward said object.

8. The combined sputtering magnetron/ion beam source of claim 7, further comprising switching means for switching connection of said cathode and target between said second direct current electric power source and ground.

9. The combined sputtering magnetron/ion beam source of claim 7, further comprising means for releasably connecting said target of a sputterable material to said cathode.

10. The combined sputtering magnetron/ion beam source of claim 8, wherein said cathode comprises a first part which is releasably engaged to and from said target of a sputterable material, and a second part spaced from said first part, said combined sputtering magnetron/ion beam source further comprising a magnetic field generation means which comprises at least one permanent magnet located between said first part and said second part in a magnetoconductive relationship therewith to generate a magnetic field that passes through said at least one ion-emitting slit.

11. The combined sputtering magnetron/ion beam source of claim 3, further comprising:

at least one permanent magnet for generating a magnetic field across said ion-emitting slit, said cathode consisting of an inner part and an outer part separated by said ion emitting slit and being electrically isolated from each other by an isolating means, said inner part of said cathode being grounded, said target of a sputterable material having a ring-shaped form and is placed onto said outer part of cathode in an electroconductive relation therewith.

12. The combined sputtering magnetron/ion beam source of claim 3, further comprising:

at least one permanent magnet for generating a magnetic field across said ion-emitting slit, said cathode consisting of an inner part and an outer part separated by said ion-emitting slit and being electrically isolated from each other by an isolating means, said negative terminal being connected to said inner part of said cathode, said outer part of said cathode being grounded, said target of a sputterable material having a disk-shaped form and is placed onto said inner part of cathode in an electroconductive relation therewith.

13. The combined sputtering magnetron/ion beam source of claim 3, further comprising:

a second direct current electric power source having a second positive terminal and a second negative terminal;

at least one permanent magnet for generating a magnetic field across said ion-emitting slit, said cathode consisting of an inner part and an outer part separated by said ion emitting slit, said first negative terminal being grounded and being connected to said outer part of said cathode, said second positive terminal being connected to said outer part of said cathode and being grounded, and said second negative terminal being connected to said outer part of said cathode, said target of a sputterable material being made in the form of a ring which is placed onto said outer part of said cathode an electroconductive relation therewith.

14. The combined sputtering magnetron/ion beam source of claim 3, further comprising:

a second direct current electric power source having a second positive terminal and a second negative terminal;

at least one permanent magnet for generating a magnetic field across said ion-emitting slit, said cathode consisting of an inner part and an outer part separated by said ion emitting slit, said first negative terminal being grounded and being connected to said outer part of said cathode, said second positive terminal being grounded and being connected to said first negative terminal, said second negative terminal being connected to said inner part of said cathode, said target of a sputterable material being placed onto said inner part of said cathode and being in an electroconductive relation therewith.

15. The combined sputtering magnetron/ion beam source of claim 3, further comprising:

said target of a sputterable material having a ring-shaped form, being separated from said cathode and is located in a space between said cathode and said object, and said object being grounded, said target of a sputterable having an opening with a diameter greater than said ion-emitting slit in order not to obstruct said ion-emitting slit.

16. The combined sputtering magnetron/ion beam source of claim 3, further comprising:

said target of a sputterable material being placed onto said cathode in an electroconductive relationship therewith, said negative terminal being connected to said cathode and to the ground via switch so that cathode together with said negative terminal is selectively connected to the ground via said switch.

17. A combined sputtering magnetron/ion beam source for treating an object comprising:

an ion beam source for emitting an ion beam in a direction toward said object, said ion beam source having a cathode, an anode, at least one ion-emitting slit in said cathode, a first electric power source for generating an electric field across said at least one ion-emitting slit, and a source of a magnetic field, said magnetic field passing through said cathode, anode, and said at least one ion-emitting slit;

a planar sputtering magnetron having a virtual anode which appears during operation of said ion-beam source and a target of a sputterable material for sputtering particles of said material, said target being located above said cathode and having at least one slit which is aligned with said at least one ion-emitting slit of said cathode for passing said ion beam sequentially through said at least one ion-emitting slit of said cathode and said at least one slit of said target in said direction toward said object;

said virtual anode being said ion beam which is positively charged with respect to said cathode and said target and functions as a virtual anode during operation of said ion source;

said planar sputtering magnetron having a direction of sputtering of said particles of a sputterable material which is coaxial with said direction of said ion beam, so that said object is treated simultaneously with said ion beam and with said particles of said sputterable material.

18. The combined sputtering magnetron/ion beam source of claim 17, wherein said first electric power source is a direct current power source having a first positive terminal and a first negative terminal, said combined sputtering magnetron/ion beam source further comprising a second direct current power source having a second positive terminal and a second negative terminal;

said object being grounded, said first positive terminal being electrically connected to said anode, said first negative terminal being connected to said cathode, said second positive terminal being grounded, and said second negative terminal being electrically connected to said first negative terminal.

19. The combined sputtering magnetron/ion beam source of claim 18, wherein said target is laid onto said cathode and is in electric contact therewith, said cathode comprising a first cathode part which supports said target and is in electric contact therewith and a second cathode part which is electrically connected to said first cathode part, said first cathode part and said target having a plurality of first openings, said first anode means having a plurality of second openings having walls, said second cathode part having a plurality of rods of a magnetoconductive material which are in magnetoconductive relationship with said first cathode part and said second cathode part, said rods passing through said second openings of said anode without contact with said walls of said second openings towards said first cathode part.

20. A combined sputtering magnetron/ion beam source apparatus for treating an object comprising:

a combination of a planar sputtering magnetron for sputtering at least one target of a sputterable material in a direction toward said object with a cold-cathode type ion source for coaxially emitting an ion beam in said direction, said cold-cathode type ion source having electrons drifting in crossed electric and magnetic field in said direction, said ion beam source having an anode, and a closed-loop ion emitting slit, and a cathode;

said planar sputtering magnetron having a virtual anode which appears during operation of said ion-beam source and a target of a sputterable material for sputtering particles of said material, said target having at least one opening aligned with said at least one ion-emitting slit for passing said ion beam toward said object, said virtual anode being said ion beam which is positively charged and functions during operation of said ion source.

21. The combined sputtering magnetron/ion beam source of claim 20 wherein a space is formed inside said combined sputtering magnetron/ion beam source for placing said object, said direction is a radial inward direction for treating said object simultaneously from opposites sides of said object.

22. The combined sputtering magnetron/closef-loop ion beam source of claim 20 wherein said ion-emitting slit is formed on an outer periphery of said cathode, said at least one target being located on an outer surface of said cathode, said direction being in a radial outward direction, so that two objects are placed on said opposite sides of said combined sputtering magnetron/ion beam source for simultaneous treatment.

23. A method of treating at least one object simultaneously with an ion beam emitted in a direction toward said at least one object and with particles of a sputterable material, comprising:

providing an ion source for emitting a beam of ions of a working medium combined with a planar sputtering magnetron for sputtering said a sputterable material, said planar sputtering magnetron having a direction of sputtering of said particles of a sputterable material which is coaxial with said direction towards said at least one object;

activating said ion source for emitting said beam of ions in said direction toward said at least one object;

activating said planar sputtering magnetron and sputtering said particles of said sputterable material simultaneously with the emission of beam of ions.

24. A combined sputtering magnetron/ion beam source for treating an object comprising:

an ion beam source for emitting an ion beam in a direction toward said object, said ion beam source having a cathode, an anode, and at least one ion-emitting slit in said cathode;

a planar sputtering magnetron having a target of a sputterable material for sputtering particles of said material, said magnetron having a direction of sputtering of said sputterable material which is coaxial with said direction toward said object, so that said object is treated simultaneously with said ion beam and with said particles of said sputterable material;

a sealed housing in which said ion beam source and said planar sputtering magnetron are located, said sealed housing being connected with a vacuum source and is evacuated, said sealed housing having an opening for connection to a source of a gaseous working medium required for operation of said ion beam source, said object being grounded and being located above said at least one ion-emitting slit, said ion-beam source being a cold-cathode type ion beam source having electrons drifting in crossed electric and magnetic fields;

a first direct current electric power source with a first positive terminal and a first negative terminal and a second direct current power source having a second positive terminal and a second negative terminal, said first positive terminal being connected to said anode, and said first negative terminal being connected to said cathode and said target of a sputterable material, said housing being electrically isolated from said cathode and said anode, said second positive terminal being grounded, and said second negative terminal being connected to said first negative terminal, said target of a sputterable material having at least one opening aligned with said at least one ion-emitting slit for passing said ion beam from said ion-beam source through said planar sputtering magnetron toward said object, said cathode comprising a first part which is releasably engaged to and from said target of a sputterable material, and a second part spaced from said first part; and a magnetic field generation means comprise at least one permanent magnet located between said first part and said second part in a magnetoconductive relationship therewith to generate a magnetic field that passes through said at least one ion-emitting slit.

25. The combined sputtering magnetron/ion beam source of claim 24, further comprising:

switching means for switching connection of said cathode and target between said second direct current source and ground, said cathode comprising a first part which is releasably engaged to and from said target of sputterable material, and a second part spaced from said first part, said combined sputtering magnetron/ion beam source further comprising a magnetic field generation means located between said first part and said second part in a magnetoconductive relationship therewith so as to generate a magnetic field that passes through said at least one ion-emitting slit.

26. A combined sputtering magnetron/ion beam source for treating an object comprising:

an ion beam source for emitting an ion beam in a direction toward said object, said ion beam source having a cathode, an anode, and at least one ion-emitting slit in said cathode;

a planar sputtering magnetron having a target of a sputterable material for sputtering particles of said material, said magnetron having a direction of sputtering of said sputterable material which is coaxial with said direction toward said object, so that said object is treated simultaneously with said ion beam and with said particles of said sputterable material;

a sealed housing in which said ion beam source and said planar sputtering magnetron are located, said sealed housing being connected with a vacuum source and is evacuated, said sealed housing having an opening for connection to a source of a gaseous working medium required for operation of said ion beam source, said object being grounded and being located above said at least one ion-emitting slit, said ion-beam source being a cold-cathode type ion beam source having electrons drifting in crossed electric and magnetic fields;

a first direct current electric power source with a first positive terminal and a first negative terminal and a second direct current power source having a second positive terminal and a second negative terminal, said first positive terminal being connected to said anode, and said first negative terminal being connected to said cathode and said target of a sputterable material, said housing being electrically isolated from said cathode and said anode, said second positive terminal being grounded, and said second negative terminal being connected to said first negative terminal, said target of a sputterable material having at least one opening aligned with said at least one ion-emitting slit for passing said ion beam from said ion-beam source through said planar sputtering magnetron toward said object;

at least one permanent magnet for generating a magnetic field across said ion-emitting slit, said cathode consisting of an inner part and an outer part separated by said ion emitting slit and being electrically isolated from each other by an isolating means, said negative terminal being connected to said outer part of said cathode, said inner part of said cathode being grounded, said target of a sputterable material having a ring-shaped form and is placed onto said outer part of cathode in an electroconductive relation therewith.

27. A combined sputtering magnetron/ion beam source for treating an object comprising:

an ion beam source for emitting an ion beam in a direction toward the said object, said ion beam source having a cathode, an anode, and at least one ion-emitting slit in said cathode;

a planar sputtering magnetron having a target of a sputterable material for sputtering particles of said material, said magnetron having a direction of sputtering of said sputterable material which is coaxial with said direction toward said object, so that said object is treated simultaneously with said ion beam and with said particles of said sputterable material;

a sealed housing in which said ion beam source and said planar sputtering magnetron are located, said sealed housing being connected with a vacuum source and is evacuated, said sealed housing having an opening for connection to a source of a gaseous working medium required for operation of said ion beam source, said object being grounded and being located above said at least one ion-emitting slit, said ion-beam source being a cold-cathode type ion beam source having electrons drifting in crossed electric and magnetic fields;

a first direct current electric power source with a first positive terminal and a first negative terminal and a second direct current power source having a second positive terminal and a second negative terminal, said first positive terminal being connected to said anode, and said first negative terminal being connected to said cathode and said target of a sputterable material, said housing being electrically isolated from said cathode and said anode, said second positive terminal being grounded, and said second negative terminal being connected to said first negative terminal, said target of a sputterable material having at least one opening aligned with said at least one ion-emitting slit for passing said ion beam from said ion-beam source through said planar sputtering magnetron toward said object;

at least one permanent magnet for generating a magnetic field across said ion-emitting slit, said cathode consisting of an inner part and an outer part separated by said ion-emitting slit and being electrically isolated from each other by an isolating means, said negative terminal being connected to said inner part of said cathode, said outer part of said cathode being grounded, said target of a sputterable material having a disk-shaped form and is placed onto said inner part of cathode in an electroconductive relation therewith.

28. A combined sputtering magnetron/ion beam source for treating an object comprising:

an ion beam source for emitting an ion beam in a direction toward said object, said ion beam source having a cathode, an anode, and at least one ion-emitting slit in said cathode;

a planar sputtering magnetron having a target of a sputterable material for sputtering particles of said material, said magnetron having a direction of sputtering of said sputterable material which is coaxial with said direction toward said object, so that said object is treated simultaneously with said ion beam and with said particles of said sputterable material;

a sealed housing in which said ion beam source and said planar sputtering magnetron are located, said sealed housing being connected with a vacuum source and is evacuated, said sealed housing having an opening for connection to a source of a gaseous working medium required for operation of said ion beam source, said object being grounded and being located above said at least one ion-emitting slit, said ion-beam source being a cold-cathode type ion beam source having electrons drifting in crossed electric and magnetic fields;

a first direct current electric power source with a first positive terminal and a first negative terminal and a second direct current power source having a second positive terminal and a second negative terminal, said first positive terminal being connected to said anode, and said first negative terminal being connected to said cathode and said target of a sputterable material, said housing being electrically isolated from said cathode and said anode, said second positive terminal being grounded, and said second negative terminal being connected to said first negative terminal, said target of a sputterable material having at least one opening aligned with said at least one ion-emitting slit for passing said ion beam from said ion-beam source through said planar sputtering magnetron toward said object;

said target of a sputterable material having a ring-shaped form, being separated from said cathode and is located in a space between said cathode and said object, and said object being grounded, said ring-shaped target of a sputterable material having an opening with a diameter greater than said ion-emitting slit in order not to obstruct the passage of the ion-emitting slit.

* * * * *